United States Patent
Matsumoto et al.

(10) Patent No.: US 11,034,058 B2
(45) Date of Patent: Jun. 15, 2021

(54) METHOD FOR MANUFACTURING SILICON CARBIDE SUBSTRATE, METHOD FOR MANUFACTURING SILICON CARBIDE EPITAXIAL SUBSTRATE, AND METHOD FOR MANUFACTURING SILICON CARBIDE SEMICONDUCTOR DEVICE

(71) Applicant: SUMITOMO ELECTRIC INDUSTRIES, LTD., Osaka (JP)

(72) Inventors: Naoki Matsumoto, Itami (JP); Kyoko Okita, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 487 days.

(21) Appl. No.: 16/078,089

(22) PCT Filed: Jan. 26, 2017

(86) PCT No.: PCT/JP2017/002724
§ 371 (c)(1),
(2) Date: Aug. 21, 2018

(87) PCT Pub. No.: WO2017/145632
PCT Pub. Date: Aug. 31, 2017

(65) Prior Publication Data
US 2021/0060818 A1   Mar. 4, 2021

(30) Foreign Application Priority Data
Feb. 22, 2016 (JP) .............................. JP2016-030772

(51) Int. Cl.
*H01L 21/02* (2006.01)
*B28D 5/04* (2006.01)
(Continued)

(52) U.S. Cl.
CPC ............ *B28D 5/045* (2013.01); *C30B 25/186* (2013.01); *C30B 25/20* (2013.01); *C30B 29/36* (2013.01);
(Continued)

(58) Field of Classification Search
CPC ............... H01L 29/1608; H01L 29/045; H01L 21/02378; H01L 21/02002;
(Continued)

(56) References Cited

U.S. PATENT DOCUMENTS 9,017,804 B2 * 4/2015 Loboda ................ C30B 23/005
428/215
9,738,991 B2 * 8/2017 Loboda ................ C30B 23/025
(Continued)

FOREIGN PATENT DOCUMENTS

JP   2015-135902 A   7/2015

*Primary Examiner* — Jaehwan Oh
(74) *Attorney, Agent, or Firm* — Faegre Drinker Biddle & Reath LLP

(57) ABSTRACT

A silicon carbide ingot is cut using a wire. The silicon carbide ingot has a polytype of 4H—SiC. The silicon carbide ingot includes a top surface, a bottom surface opposite to the top surface, and a side surface between the top surface and the bottom surface. A direction from the bottom surface toward the top surface is a direction parallel to a [0001] direction or a direction inclined by less than or equal to 8° relative to the [0001] direction. In the cutting of the silicon carbide ingot, the silicon carbide ingot is cut from the side surface at a (000-1) plane side along a straight line parallel to a direction within ±5° relative to a direction that bisects an angle formed by a [1-100] direction and a [11-20] direction when viewed in the direction from the bottom surface toward the top surface.

9 Claims, 20 Drawing Sheets

(51) Int. Cl.
  *C30B 25/20* (2006.01)
  *C30B 25/18* (2006.01)
  *C30B 29/36* (2006.01)
  *H01L 29/16* (2006.01)

(52) U.S. Cl.
  CPC .... *H01L 21/0262* (2013.01); *H01L 21/02378* (2013.01); *H01L 21/02529* (2013.01); *H01L 29/1608* (2013.01)

(58) Field of Classification Search
  CPC ......... H01L 21/02433; H01L 21/02529; H01L 21/02; H01L 21/02005; H01L 21/02008
  See application file for complete search history.

(56) References Cited

U.S. PATENT DOCUMENTS

| | | | |
|---|---|---|---|
| 9,797,064 B2* | 10/2017 | Loboda | C23C 14/0635 |
| 10,427,324 B2* | 10/2019 | Hori | C30B 23/025 |
| 2011/0206929 A1* | 8/2011 | Nakabayashi | C30B 25/00 |
| | | | 428/367 |
| 2012/0280363 A1* | 11/2012 | Sumida | H01L 29/2003 |
| | | | 257/615 |
| 2013/0020585 A1* | 1/2013 | Ishibashi | H01L 21/046 |
| | | | 257/77 |
| 2013/0061801 A1* | 3/2013 | Fujiwara | C30B 29/36 |
| | | | 117/105 |
| 2013/0256700 A1* | 10/2013 | Ishibashi | H01L 21/02002 |
| | | | 257/77 |
| 2018/0277635 A1* | 9/2018 | Wada | H01L 21/02576 |
| 2018/0323262 A1* | 11/2018 | Hori | H01L 21/02433 |
| 2020/0388683 A1* | 12/2020 | Okita | H01L 29/1608 |

* cited by examiner

▨ 13.950~18.840
▨ 7.429~13.950
▨ 0.908~7.429
▨ -5.613~0.908
▨ -12.134~-5.613
▨ -17.024~-12.134

☒ 8.060～10.953
☒ 4.203～8.060
☒ 0.348～4.203
☒ -3.611～0.348
☒ -7.368～-3.611
☒ -10.261～-7.368

METHOD FOR MANUFACTURING SILICON CARBIDE SUBSTRATE, METHOD FOR MANUFACTURING SILICON CARBIDE EPITAXIAL SUBSTRATE, AND METHOD FOR MANUFACTURING SILICON CARBIDE SEMICONDUCTOR DEVICE

TECHNICAL FIELD

The present disclosure relates to a method for manufacturing a silicon carbide substrate, a method for manufacturing a silicon carbide epitaxial substrate, and a method for manufacturing a silicon carbide semiconductor device. The present application claims a priority based on Japanese Patent Application No. 2016-030772 filed on Feb. 22, 2016, the entire content of which is incorporated herein by reference.

BACKGROUND ART

For example, Japanese Patent Laying-Open No. 2015-135902 (Patent Document 1) describes a method for cutting a silicon carbide ingot using a wire saw.

CITATION LIST

Patent Document

PTD 1: Japanese Patent Laying-Open No. 2015-135902

SUMMARY OF INVENTION

A method for manufacturing a silicon carbide substrate according to the present disclosure includes the following steps. A silicon carbide ingot is prepared. The silicon carbide ingot is cut using a wire. The silicon carbide ingot has a polytype of 4H—SiC. The silicon carbide ingot includes a top surface, a bottom surface opposite to the top surface, and a side surface between the top surface and the bottom surface. A direction from the bottom surface toward the top surface is a direction parallel to a direction or a direction inclined by less than or equal to 8° relative to the [0001] direction. In the cutting of the silicon carbide ingot, the silicon carbide ingot is cut from the side surface at a (000-1) plane side along a straight line parallel to a direction within ±5° relative to a direction that bisects an angle formed by a [1-100] direction and a [11-20] direction when viewed in the direction from the bottom surface toward the top surface.

A method for manufacturing a silicon carbide substrate according to the present disclosure includes the following steps. A silicon carbide ingot is prepared. The silicon carbide ingot is cut using a wire. The silicon carbide ingot has a polytype of 4H—SiC. The silicon carbide ingot includes a top surface, a bottom surface opposite to the top surface, and a side surface between the top surface and the bottom surface. A direction from the bottom surface toward the top surface is a direction parallel to a [0001] direction or a direction inclined by less than or equal to 8° relative to the [0001] direction. In the cutting of the silicon carbide ingot, the silicon carbide ingot is cut from the side surface at a (000-1) plane side along a straight line parallel to a direction within ±5° relative to a direction that bisects an angle formed by a [1-100] direction and a [11-20] direction when viewed in the direction from the bottom surface toward the top surface. In the cutting of the silicon carbide ingot, a linear velocity of the wire is more than or equal to 1000 m/minute, and a tension of the wire is less than or equal to 70% of a breaking tension of the wire. A diameter of the wire is less than or equal to 200 μm. A diamond abrasive grain is fixed to the wire. A grain size of the diamond abrasive grain is less than or equal to 50 μm.

DETAILED DESCRIPTION

Figure 1:
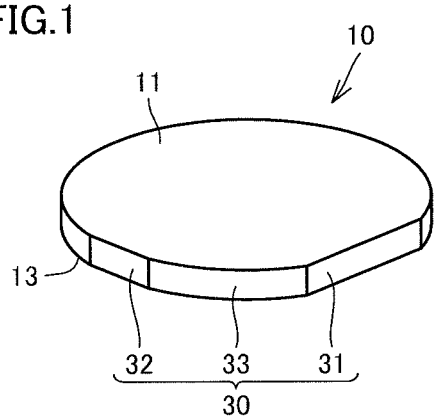
FIG. 1 is a schematic perspective view showing a configuration of a silicon carbide substrate according to the present embodiment.

Problem to be Solved by the Present Disclosure

An object of the present disclosure is to provide a method for manufacturing a silicon carbide substrate, a method for manufacturing a silicon carbide epitaxial substrate, and a method for manufacturing a silicon carbide semiconductor device, by each of which SORT of the silicon carbide substrate can be reduced and flaws can be reduced. Assuming that a least-squares plane of a surface of a substrate is a reference plane, the term "SORI" refers to a total of a distance from the maximum point of the surface to the reference plane and a distance from the minimum point of the surface to the reference plane in a direction perpendicular to the reference plane.

Advantageous Effect of the Present Disclosure

According to the present disclosure, there can be provided a method for manufacturing a silicon carbide substrate, a method for manufacturing a silicon carbide epitaxial substrate, and a method for manufacturing a silicon carbide semiconductor device, by each of which SORI of the silicon carbide substrate can be reduced and flaws can be reduced.

Description of Embodiments

First, an overview of an embodiment of the present disclosure will be described. Regarding crystallographic indications in the present specification, an individual orientation is represented by [ ], a group orientation is represented by < >, an individual plane is represented by ( ) and a group plane is represented by { }. A negative index is supposed to be crystallographically indicated by putting "-" (bar) above a numeral, but is indicated by putting the negative sign before the numeral in the present specification.

(1) A method for manufacturing a silicon carbide substrate 10 according to the present disclosure includes the following steps. A silicon carbide ingot 1 is prepared. Silicon carbide ingot 1 is cut using a wire 2. Silicon carbide ingot 1 has a polytype of 4H—SiC. Silicon carbide ingot 1 includes a top surface 3, a bottom surface 4 opposite to top surface 3, and a side surface 5 between top surface 3 and bottom surface 4. A direction 104 from bottom surface 4 toward top surface 3 is a direction parallel to a [0001] direction or a direction inclined by less than or equal to 8° relative to the [0001] direction. In the cutting of silicon carbide ingot 1, silicon carbide ingot 1 is cut from side surface 5 at a (000-1) plane side along a straight line parallel to a direction within ±5° relative to a direction that bisects an angle formed by a [1-100] direction and a [11-20] direction when viewed in the direction from bottom surface 4 toward top surface 3.

A silicon carbide crystal includes: a (0001) plane (hereinafter, also referred to as "silicon plane") terminated with silicon atoms; and a (000-1) plane (hereinafter, also referred to as "carbon plane") terminated with carbon atoms. The silicon plane and the carbon plane are different from each other in terms of physical and chemical properties. Moreover, hexagonal silicon carbide has such a characteristic that the hexagonal silicon carbide is cleaved along a [1-100] direction and a [11-20] direction.

A silicon carbide substrate is obtained by cutting a silicon carbide ingot using a wire, for example. As a result of diligent study by the inventors, it was found that when the silicon carbide ingot is cut by traveling the wire in the cleavage direction of the silicon carbide, flaws, such as cracks and saw marks, are likely to occur in the slice surface of the obtained silicon carbide substrate. In other words, the flaws of the silicon carbide substrate can be reduced by cutting the silicon carbide ingot along a direction inclined relative to each of the [1-100] direction and the [11-20] direction, each of which is the cleavage direction. Moreover, it was found that the SORI of the silicon carbide substrate becomes different depending on a cut-in direction of the wire relative to the silicon carbide ingot. Specifically, the SORI of the silicon carbide substrate can be reduced when the silicon carbide ingot is cut from the carbon plane side, as compared with a case where the silicon carbide ingot is cut from the silicon plane side.

(2) In the cutting of the silicon carbide ingot in the method for manufacturing silicon carbide substrate 10 according to (1), a linear velocity of wire 2 may be more than or equal to 1000 m/minute. Accordingly, processing time can be reduced. This results in reduced damage in the silicon carbide substrate and reduced SORI of the silicon carbide substrate.

(3) In the cutting of the silicon carbide ingot in the method for manufacturing silicon carbide substrate 10 according to (1) or (2), a tension of wire 2 may be less than or equal to 70% of a breaking tension of wire 2.

(4) In the method for manufacturing silicon carbide substrate 10 according to any one of (1) to (3), a diameter of wire 2 may be less than or equal to 200 μm. Accordingly, kerf of the silicon carbide ingot can be reduced.

(5) In the method for manufacturing silicon carbide substrate 10 according to any one of (1) to (4), a diamond abrasive grain 6 may be fixed to wire 2. Accordingly, processing time can be reduced as compared with a case of loose grains. This results in reduced damage in the silicon carbide substrate and reduced SORT of the silicon carbide substrate.

(6) In the method for manufacturing silicon carbide substrate 10 according to (5), a grain size of diamond abrasive grain 6 may be less than or equal to 50 μm. Accordingly, kerf of the silicon carbide ingot can be reduced.

(7) A method for manufacturing a silicon carbide substrate 10 according to the present disclosure includes the following steps. A silicon carbide ingot 1 is prepared. Silicon carbide ingot 1 is cut using a wire 2. Silicon carbide ingot 1 has a polytype of 4H—SiC. Silicon carbide ingot 1 includes a top surface 3, a bottom surface 4 opposite to top surface 3, and a side surface 5 between top surface 3 and bottom surface 4. A direction 104 from bottom surface 4 toward top surface 3 is a direction parallel to a direction or a direction inclined by less than or equal to 8° relative to the [0001] direction. In the cutting of silicon carbide ingot 1, silicon carbide ingot 1 is cut from side surface 5 at a (000-1) plane side along a straight line parallel to a direction within ±5° relative to a direction that bisects an angle formed by a [1-100] direction and a [11-20] direction when viewed in the direction from bottom surface 4 toward top surface 3. In the cutting of silicon carbide ingot 1, a linear velocity of wire 2 is more than or equal to 1000 m/minute, and a tension of wire 2 is less than or equal to 70% of a breaking tension of wire 2. A diameter of wire 2 is less than or equal to 200 μm. A diamond abrasive grain 6 is fixed to wire 2. A grain size of diamond abrasive grain 6 is less than or equal to 50 μm. Accordingly, there can be obtained a silicon carbide substrate having reduced SORT and reduced flaws.

(8) A method for manufacturing a silicon carbide epitaxial substrate 100 according to the present disclosure includes the following steps. A silicon carbide substrate 10 is prepared by the manufacturing method recited in any one of (1) to (7). A silicon carbide layer 20 is formed on silicon carbide substrate 10. Accordingly, the SORI of the silicon carbide epitaxial substrate can be reduced and the flaws of the silicon carbide epitaxial substrate can be reduced.

(9) A method for manufacturing a silicon carbide semiconductor device 200 according to the present disclosure includes the following steps. A silicon carbide epitaxial substrate 100 is prepared by the manufacturing method recited in (8). Silicon carbide epitaxial substrate 100 is processed. Accordingly, a yield of the silicon carbide semiconductor device can be improved.

Details of Embodiments of the Present Disclosure

Hereinafter, details of the embodiments of the present disclosure will be described with reference to figures. First, the following describes a configuration of a silicon carbide substrate 10 manufactured by a method for manufacturing silicon carbide substrate 10 according to the present embodiment. It should be noted that in the below-described figures, the same or corresponding portions are given the same reference characters and are not described repeatedly.

As shown in FIG. 1, silicon carbide substrate 10 according to the present embodiment mainly includes: a first main surface 11; a second main surface 13 opposite to first main surface 11; and a circumferential edge portion 30. First main surface 11 corresponds to a (0001) plane or a plane inclined in an off direction relative to the (0001) plane, for example. First main surface 11 corresponds to a plane inclined by more than or equal to 0.5° and less than or equal to 8° relative to the (0001) plane, for example. The inclination direction (off direction) of first main surface 11 is a <11-20> direction, for example. The off direction may be a <1-100> direction or may be a direction including a <11-20> direction component and a <1-100> direction component, for example. The inclination angle (off angle) thereof relative to the (0001) plane may be more than or equal to 1° or may be more than or equal to 2°. The off angle may be less than or equal to 7° or may be less than or equal to 6°.

Circumferential edge portion 30 includes a first orientation flat 31 (hereinafter, also referred to as "first flat"), a second orientation flat 32 (hereinafter, also referred to as "second flat"), and a curved portion 33, for example. First flat 31 extends along the <11-20> direction, for example. First flat 31 corresponds to a (1-100) plane, for example. Second flat 32 extends along the <1-100> direction, for example. Second flat 32 corresponds to a (11-20) plane, for example.

Silicon carbide substrate 10 is constituted of a silicon carbide single crystal. The silicon carbide single crystal has a polytype of 4H—SiC, for example. 4H—SiC is superior to other polytypes in terms of electron mobility, dielectric strength, and the like. Silicon carbide substrate 10 includes an n type impurity such as nitrogen, for example. The conductivity type of silicon carbide substrate 10 is n type, for example. The diameter of first main surface 11 is more than or equal to 100 mm. The diameter may be more than or equal to 150 mm, may be more than or equal to 200 mm, or may be more than or equal to 250 mm. The upper limit of the diameter is not limited in particular. The upper limit of the diameter may be 300 mm, for example. It should be noted that details of the shape of the silicon carbide substrate will be described later.

Next, the following describes a method for manufacturing the silicon carbide substrate according to the present embodiment.

Figure 2:
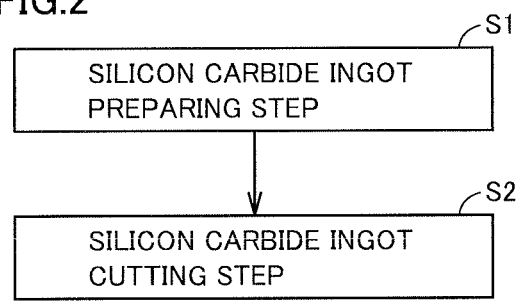
FIG. 2 is a flowchart schematically showing a method for manufacturing the silicon carbide substrate according to the present embodiment.

First, a silicon carbide ingot preparing step (S1: FIG. 2) is performed. For example, a silicon carbide ingot 1 is manufactured by a sublimation method. For example, a seed crystal and a silicon carbide source material are placed in a container composed of graphite. The seed crystal is composed of single-crystal silicon carbide. The silicon carbide source material is composed of solid-state polycrystal silicon carbide powder. The silicon carbide source material sublimates onto the seed crystal, thereby growing a silicon carbide ingot on the seed crystal. During the growth of the silicon carbide ingot, nitrogen to serve as a donor is introduced, for example. As a result, the silicon carbide ingot includes nitrogen. The silicon carbide ingot is composed of a silicon carbide single crystal having a polytype of 4H, for example. In other words, the polytype of the silicon carbide ingot is 4H—SiC.

Figure 3:
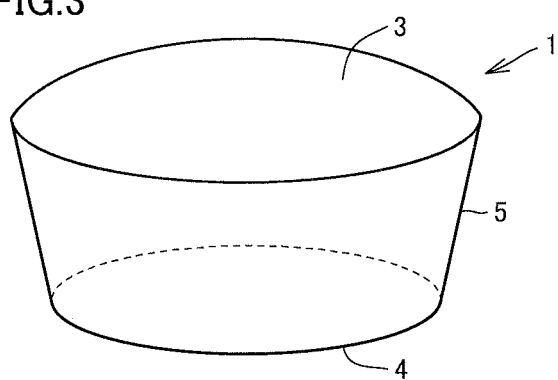
FIG. 3 is a schematic perspective view showing a first step of the method for manufacturing the silicon carbide substrate according to the present embodiment.

As shown in FIG. 3, silicon carbide ingot 1 includes a top surface 3, a bottom surface 4 opposite to top surface 3, and a side surface 5. Side surface 5 is located between top surface 3 and bottom surface 4. Side surface 5 is provided continuous to top surface 3, and is provided continuous to bottom surface 4. Top surface 3 is a protruding curved surface, for example. Bottom surface 4 has a substantially flat, circular shape, for example. When viewed in a side view, side surface 5 has a width that is increased in a direction from bottom surface 4 toward top surface 3. When the silicon carbide single crystal is manufactured by the sublimation method using a crucible, top surface 3 is a surface facing the silicon carbide source material and bottom surface 4 is a surface facing the seed substrate.

Figure 4:
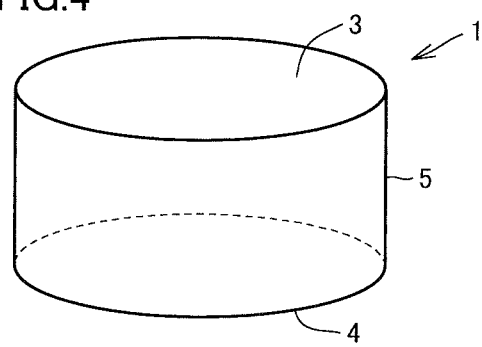
FIG. 4 is a schematic perspective view showing a second step of the method for manufacturing the silicon carbide substrate according to the present embodiment.

Next, a shaping process is performed to silicon carbide ingot 1. For example, a grindstone is employed to grind top surface 3 and side surface 5 of silicon carbide ingot 1. Accordingly, silicon carbide ingot 1 is shaped to have a substantially cylindrical shape (see FIG. 4). Silicon carbide ingot 1 includes: top surface 3 having a substantially circular shape; bottom surface 4 having a substantially circular shape; and side surface 5 having a substantially annular shape.

Figure 5:
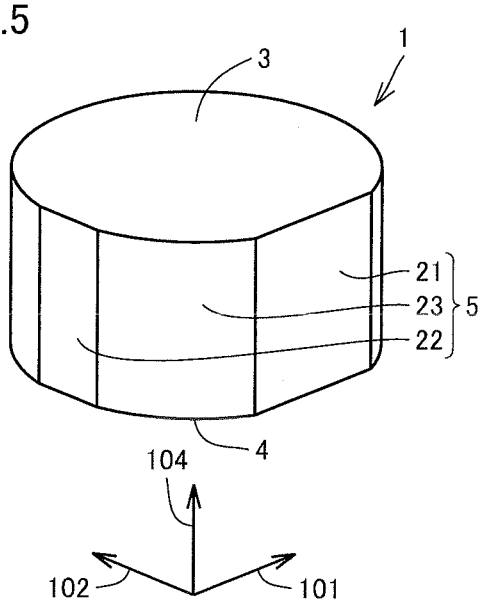
FIG. 5 is a schematic perspective view showing a third step of the method for manufacturing the silicon carbide substrate according to the present embodiment.

Next, first orientation flat 21 and second orientation flat 22 are formed at side surface 5 of silicon carbide ingot 1 (see FIG. 5). For example, first orientation flat 21 is formed to expose the (1-100) plane at side surface 5. First orientation flat 21 is a flat surface extending in a first direction 101. First direction 101 is the [11-20] direction, for example. Similarly, second orientation flat 22 is formed to expose the (11-20) plane at side surface 5. Second orientation flat 22 is a flat surface extending in a second direction 102. Second direction 102 is the [1-100] direction, for example. In side surface 5, a region other than first orientation flat 21 and second orientation flat 22 is a curved portion 23. Curved portion 23 is located between first orientation flat 21 and second orientation flat 22.

Figure 6:
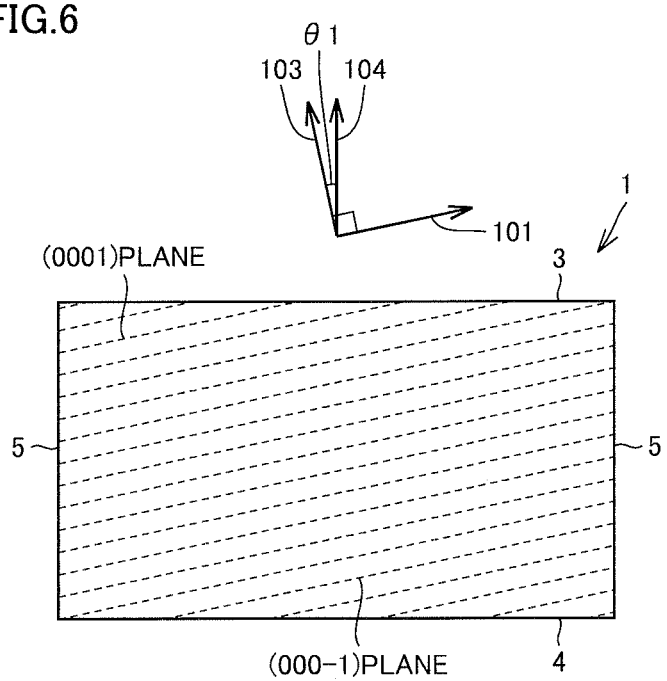
FIG. 6 is a schematic cross sectional view showing the third step of the method for manufacturing the silicon carbide substrate according to the present embodiment.

As shown in FIG. 6, when viewed in a direction parallel to top surface 3, silicon carbide ingot 1 has a substantially rectangular shape. Top surface 3 is substantially parallel to bottom surface 4. Top surface 3 corresponds to the (0001) plane or a plane inclined by less than or equal to 8° in an off direction relative to the (0001) plane, for example. Off direction 101 is, for example, the <11-20> direction, and is particularly the [11-20] direction. A fourth direction 104 from bottom surface 4 toward top surface 3 is a direction parallel to the [0001] direction or a direction inclined by less than or equal to 8° relative to the [0001] direction. For example, fourth direction 104 from the center of bottom surface 4 toward the center of top surface 3 is the direction inclined by less than or equal to 8° relative to the [0001] direction. Fourth direction 104 is inclined by an angle θ1 relative to a third direction 103 perpendicular to the (0001) plane. Angle θ1 is the same angle as the off angle, for example. Fourth direction 104 is a direction in which silicon carbide ingot 1 is grown in the step of growing silicon carbide ingot 1 by the sublimation method, for example.

In order to reduce damage of silicon carbide ingot 1, the outer circumference portion of silicon carbide ingot 1 is preferably processed using a grindstone with a high grit size and a polishing agent. Silicon carbide ingot 1 may be shaped through a discharging process. After the shaping process, annealing, wet etching, or dry etching may be performed to reduce processing damage on silicon carbide ingot 1.

Next, a silicon carbide ingot cutting step (S2: FIG. 2) is performed. Silicon carbide ingot 1 is cut using a silicon carbide ingot cutting apparatus 300 shown in FIG. 7, for example. Cutting apparatus 300 mainly has guide rollers 52, a wire 2, and nozzles 54. Two guide rollers 52 are provided, for example. The silicon carbide ingot is placed between two guide rollers 52. Each of guide rollers 52 is composed of a resin, for example. V-shaped wire guide grooves 53 are provided in the outer circumferential surfaces of guide rollers 52. By adjusting an interval between wire guide grooves 53, the thickness of silicon carbide substrate 10 can be adjusted. Wire 2 is wound around guide rollers 52 along wire guide grooves 53. Nozzles 54 are provided between silicon carbide ingot 1 and guide rollers 52, for example.

A tension is applied to wire 2. The tension of wire 2 is, for example, less than or equal to 70% of a breaking tension of wire 2, is preferably less than or equal to 60% of the breaking tension of wire 2, and is more preferably less than or equal to 50% of the breaking tension of wire 2. When the tension of wire 2 is large, wire 2 may become broken. On the other hand, when the tension of wire 2 is small, wire 2 sags to result in large SORT of silicon carbide substrate 10 to be cut out from silicon carbide ingot 1. The breaking tension of the wire can be measured in accordance with a method described in JIS Z2241 of the Japanese Industrial Standard, for example.

Figure 8:
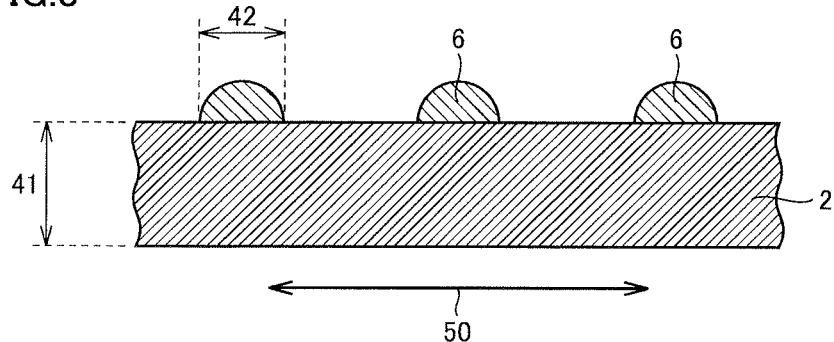
FIG. 8 is a schematic cross sectional view showing a configuration of a wire saw of the apparatus for manufacturing the silicon carbide substrate according to the present embodiment.

As shown in FIG. 8, diamond abrasive grains 6 are fixed to wire 2, for example. The diamond abrasive grains are fixed to the outer circumferential surface of wire 2 by using electrodeposition, a resin, or the like, for example. Wire 2 is obtained by providing brass plating to a piano wire composed of carbon steel or the like, for example. Wire 2 is a fixed abrasive wire having diamond abrasive grains 6 fixed thereon, for example.

A diameter 41 (see FIG. 8) of wire 2 is, for example, less than or equal to 200 μm, is preferably less than or equal to 120 μm, and is more preferably less than or equal to 80 μm. Although the lower limit of diameter 41 of wire 2 is not limited in particular, diameter 41 of wire 2 is more than or equal to 70 μm, for example. Although the number of windings of the wire depends on the thickness of the silicon carbide ingot to be sliced, the number of windings of the wire is more than or equal to 20 and less than or equal to 30, for example.

An average grain size 42 (see FIG. 8) of diamond abrasive grains 6 is, for example, less than or equal to 50 μm, is preferably less than or equal to 15 μm, and is more preferably less than or equal to 10 μm. Although the lower limit of average grain size 42 of diamond abrasive grains 6 is not limited in particular, the lower limit is more than or equal to 4 μm, for example.

Figure 9:
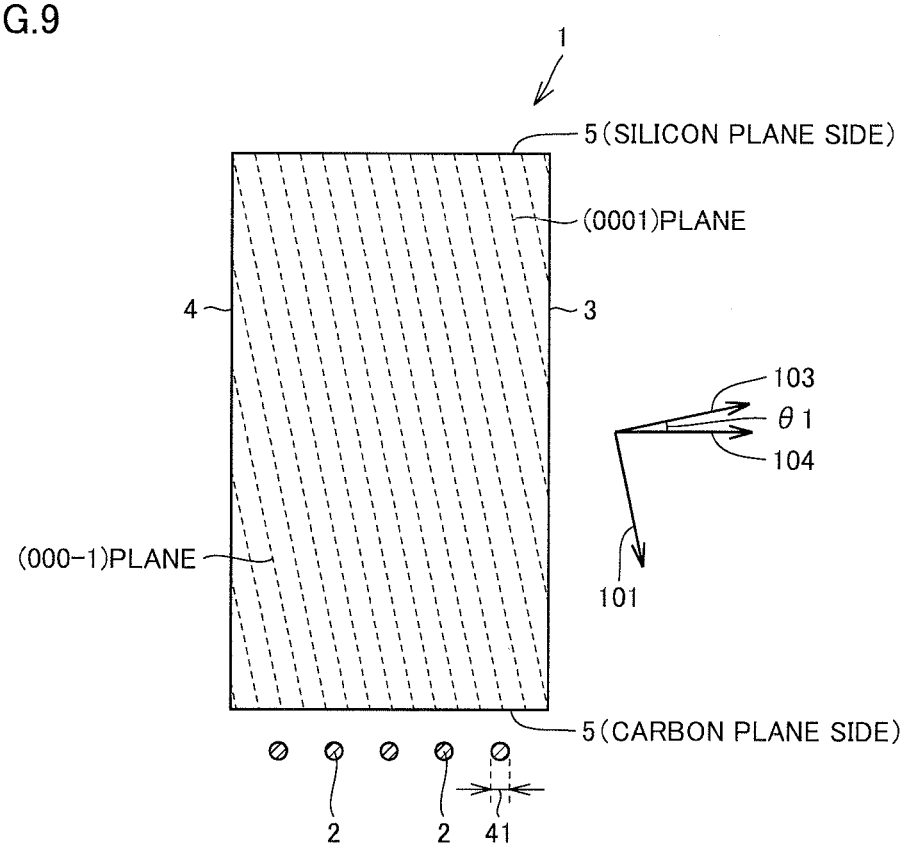
FIG. 9 is a schematic cross sectional view showing a fourth step of the method for manufacturing the silicon carbide substrate according to the present embodiment.
Figure 10:
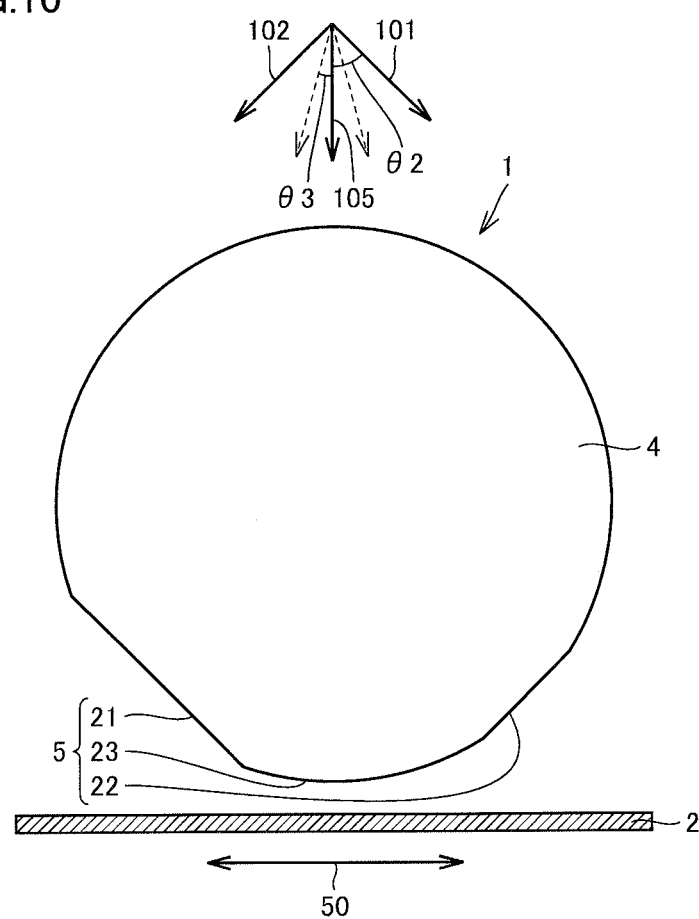
FIG. 10 is a schematic front view showing the fourth step of the method for manufacturing the silicon carbide substrate according to the present embodiment.

As shown in FIG. 9 and FIG. 10, first, wire 2 is placed to face side surface 5 of silicon carbide ingot 1. Wire 2 is placed to face side surface 5 at the (000-1) plane side (in other words, the carbon plane side), rather than side surface 5 at the (0001) plane side (in other words, the silicon plane side). The expression "side surface 5 at the (000-1) plane side" refers to a portion of side surface 5 facing the (000-1) plane. On the other hand, the expression "side surface 5 at the (0001) plane side" refers to a portion of side surface 5 facing the (0001) plane.

Next, silicon carbide ingot 1 is brought to be close to wire 2 with wire 2 being moved in a reciprocating manner in a longitudinal direction 50 of wire 2. Silicon carbide ingot 1 is brought into contact with wire 2, thereby starting to cut silicon carbide ingot 1. That is, silicon carbide ingot 1 is cut by wire 2.

Figure 11:
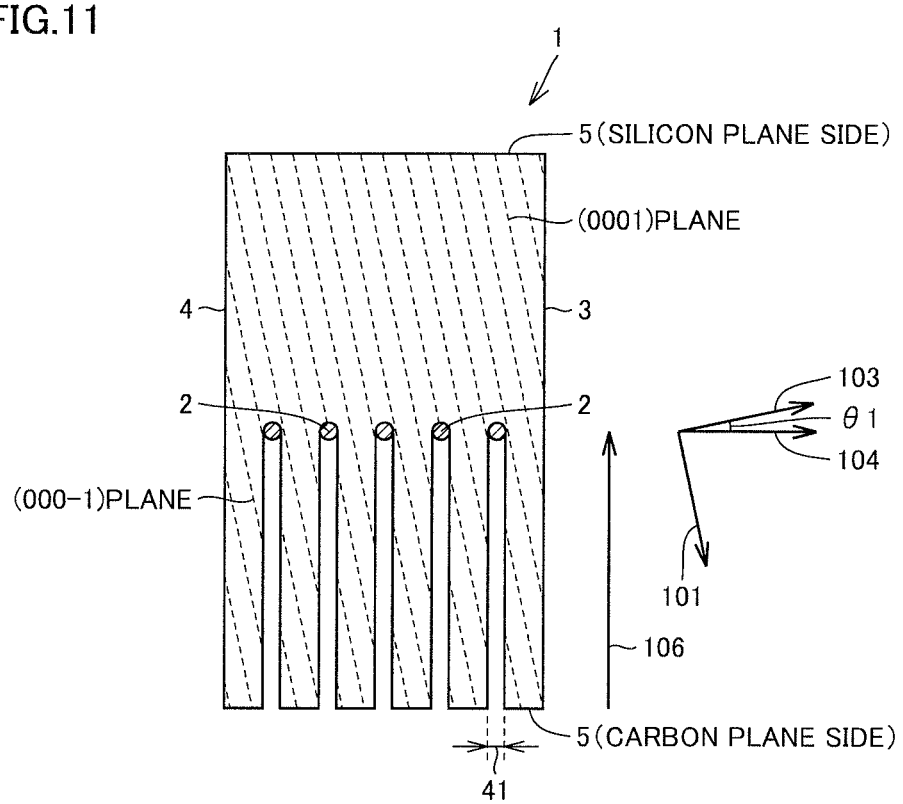
FIG. 11 is a schematic cross sectional view showing a fifth step of the method for manufacturing the silicon carbide substrate according to the present embodiment.
Figure 12:
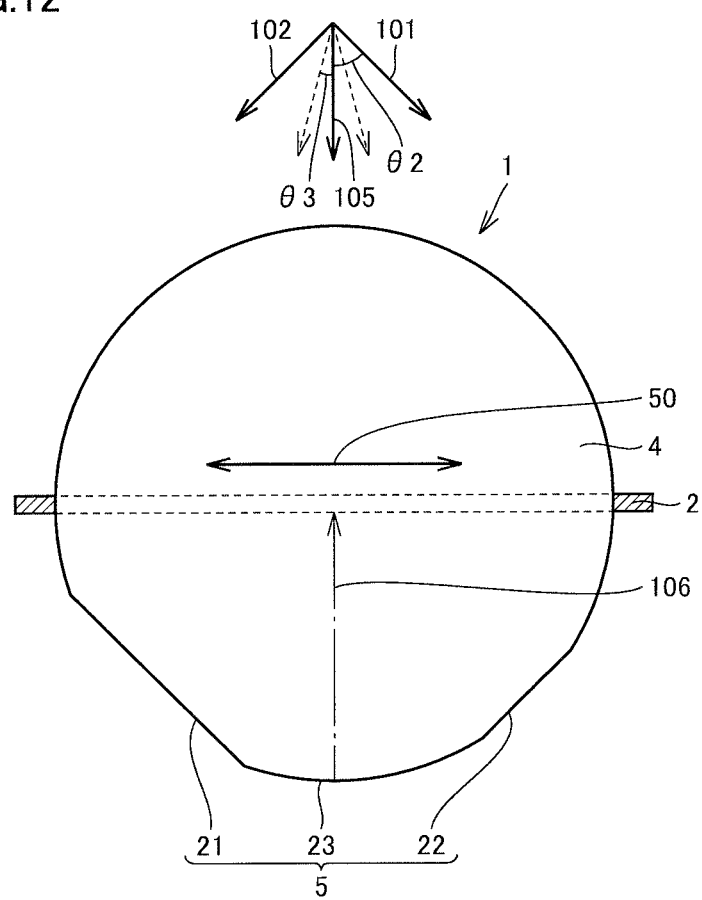
FIG. 12 is a schematic front view showing the fifth step of the method for manufacturing the silicon carbide substrate according to the present embodiment.

As shown in FIG. 11 and FIG. 12, silicon carbide ingot 1 is cut from side surface 5 at the (000-1) plane side. That is, in the cutting, wire 2 comes into side surface 5 at the (000-1) plane side. When wire 2 is seen from silicon carbide ingot 1, wire 2 is moved from outside of silicon carbide ingot 1 to inside of silicon carbide ingot 1 via side surface 5 at the (000-1) side. It should be noted that silicon carbide ingot 1 may be moved in contact with wire 2 with wire 2 being fixed, or wire 2 may be moved in contact with silicon carbide ingot 1 with silicon carbide ingot 1 being fixed.

Figure 7:
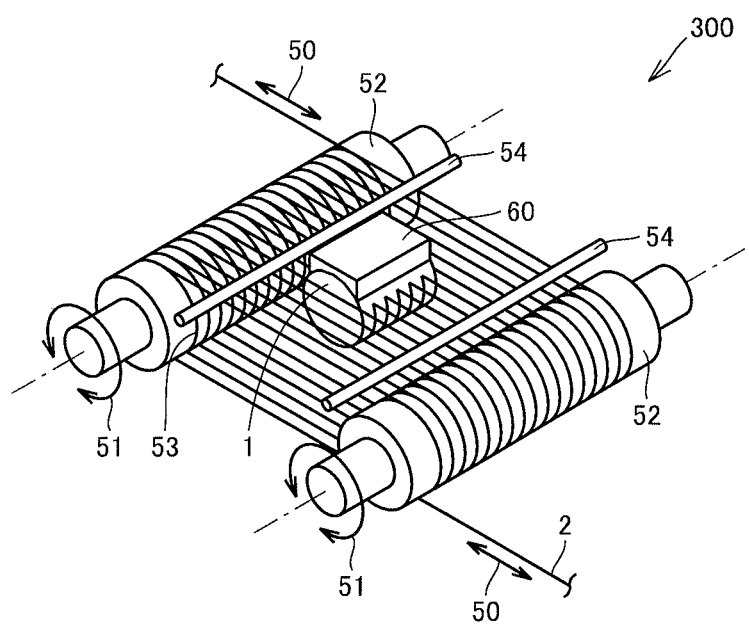
FIG. 7 is a schematic perspective view showing a configuration of an apparatus for manufacturing the silicon carbide substrate according to the present embodiment.

As shown in FIG. 7, guide roller 52 is repeatedly rotated forwardly and backwardly alternately in a direction of arrows 51. Accordingly, wire 2 is moved in the reciprocating manner along longitudinal direction 50 of wire 2. By bringing wire 2 into contact with silicon carbide ingot 1 while moving wire 2 in the reciprocating manner, silicon carbide ingot 1 is cut. A linear velocity of wire 2 is, for example, more than or equal to 1000 m/minute, is preferably more than or equal to 1500 m/minute, and is more preferably more than or equal to 2000 m/minute.

Wire 2 and silicon carbide ingot 1 are shaken to allow wire 2 to be in point contact with silicon carbide ingot 1. When cutting silicon carbide ingot 1 by wire 2, coolant is sprayed from nozzles 54 to portions currently being cut. As the coolant, a water-soluble grinding liquid is used, for example.

As shown in FIG. 12, silicon carbide ingot 1 is cut along a straight line parallel to a direction within an angle θ3 relative to a direction 105 that bisects an angle formed by the [1-100] direction and the [11-20] direction when viewed in the direction from bottom surface 4 toward top surface 3. Angle θ3 is ±5°. In other words, a cutting direction 106 of silicon carbide ingot 1 is a direction obtained by projecting, onto first main surface 11, the straight line parallel to the direction within ±5° relative to direction 105 that bisects the angle formed by the [1-100] direction and the [11-20] direction. When viewed in the direction from bottom surface 4 toward top surface 3, angle θ2 of 45° is formed by first direction 101 and direction 105 that bisects the angle formed by the [1-100] direction and the [11-20] direction. Angle θ3 is preferably ±4°, and is more preferably ±3°.

Figure 13:
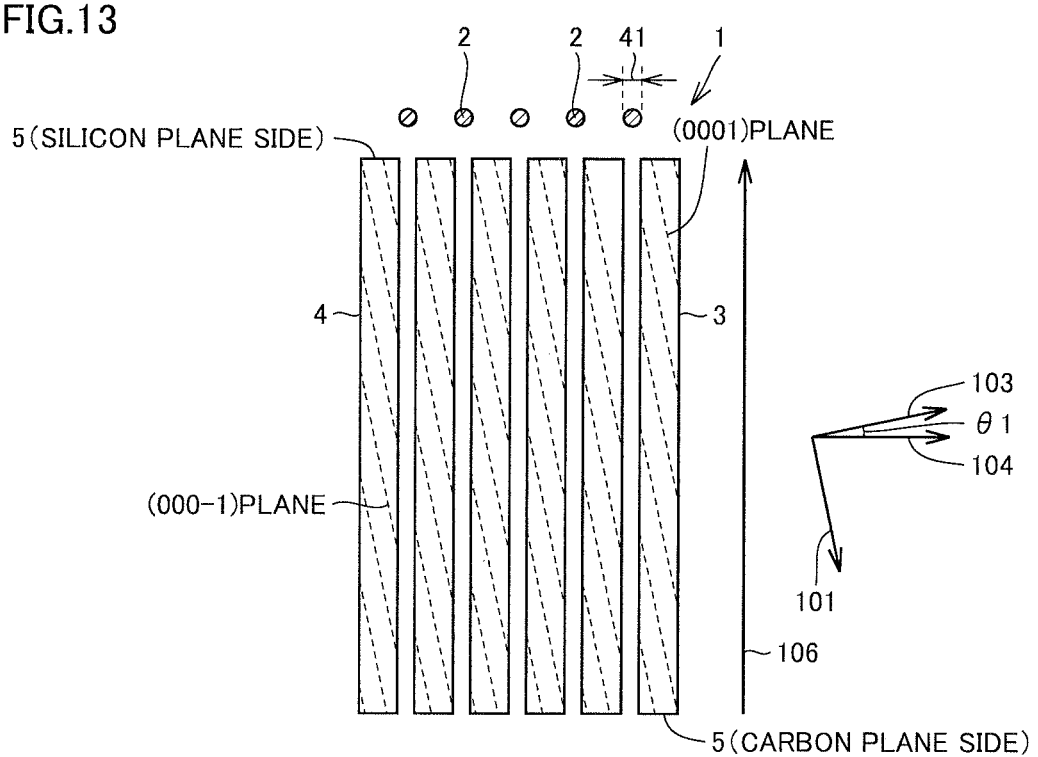
FIG. 13 is a schematic cross sectional view showing a sixth step of the method for manufacturing the silicon carbide substrate according to the present embodiment.
Figure 14:
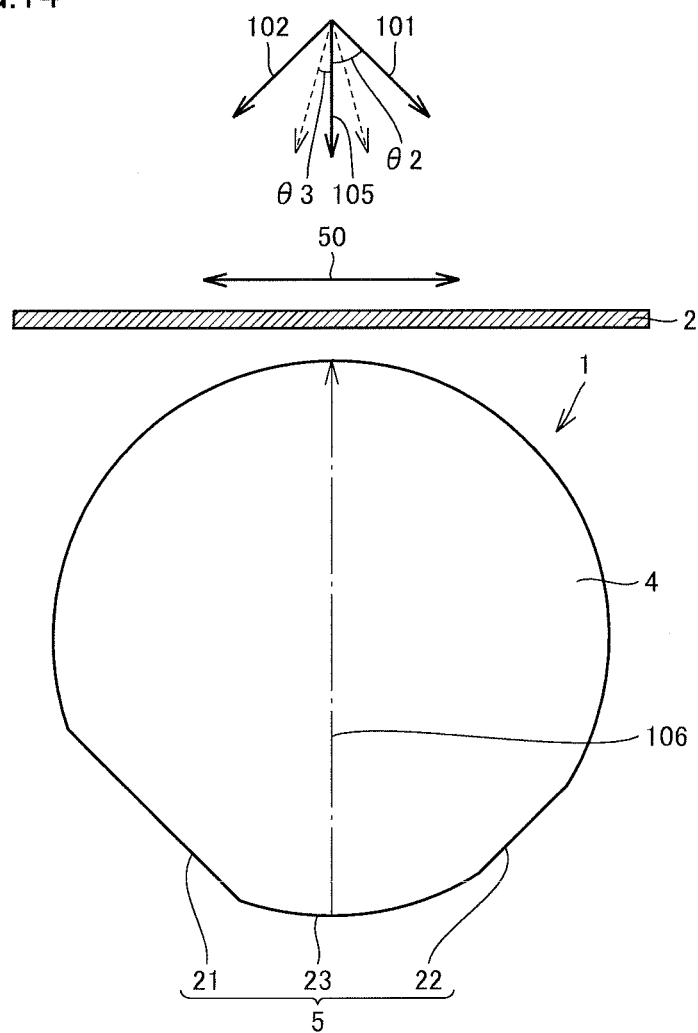
FIG. 14 is a schematic front view showing the sixth step of the method for manufacturing the silicon carbide substrate according to the present embodiment.

As shown in FIG. 13 and FIG. 14, the cutting of silicon carbide ingot 1 is finished on side surface 5 at the (0001) plane side. That is, wire 2 is moved out of silicon carbide ingot 1 via side surface 5 at the (0001) plane side. When wire 2 is seen from silicon carbide ingot 1, wire 2 is moved from the inside of silicon carbide ingot 1 to the outside of silicon carbide ingot 1 via side surface 5 at the (0001) side. Accordingly, a plurality of silicon carbide substrates 10 (see FIG. 1) are obtained. First main surface 11 of silicon carbide substrate 10 corresponds to a plane inclined by less than or equal to 8° relative to the (0001) plane in the <11-20> direction, for example.

For example, first main surface 11 and second main surface 13 of silicon carbide substrate 10 are mechanically polished using diamond abrasive grains, for example. Next, chemical mechanical polishing is performed onto first main surface 11 and second main surface 13 using colloidal silica, for example. In this way, silicon carbide substrate 10 is obtained (see FIG. 1).

In the above-described embodiment, it should be noted that there has been described the method in which silicon carbide substrate 10 having first main surface 11 inclined by less than or equal to about 8° relative to the (0001) plane in the off direction is obtained by: employing silicon carbide ingot 1 having top surface 3 inclined by less than or equal to about 8° relative to the (0001) plane in the off direction; and cutting silicon carbide ingot 1 along the plane perpendicular to direction 104 (see FIG. 6) from top surface 3 toward bottom surface 4. However, the present disclosure is not limited to this embodiment. For example, silicon carbide substrate 10 having first main surface 11 inclined by less than or equal to about 8° relative to the (0001) plane in the off direction may be obtained by: employing silicon carbide ingot 1 having top surface 3 corresponding to the (0001) plane and bottom surface 4 corresponding to the (000-1) plane; and cutting silicon carbide ingot 1 along a plane inclined relative to direction 104 from top surface 3 toward bottom surface 4.

(Method for Manufacturing Silicon Carbide Epitaxial Substrate)

Next, the following describes a method for manufacturing a silicon carbide epitaxial substrate.

Figure 15:
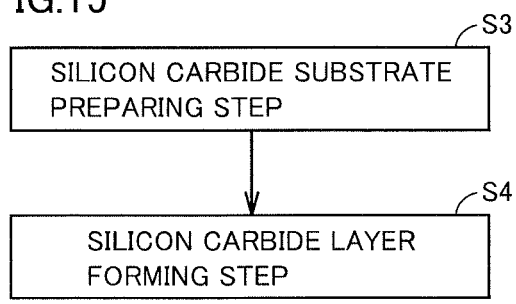
FIG. 15 is a flowchart schematically showing a method for manufacturing a silicon carbide epitaxial substrate according to the present embodiment.

The method for manufacturing the silicon carbide epitaxial substrate according to the present embodiment mainly includes a silicon carbide substrate preparing step (S3: FIG. 15) and a silicon carbide layer forming step (S4: FIG. 15). First, the silicon carbide substrate preparing step (S3: FIG. 15) is performed using the above-described method for manufacturing the silicon carbide substrate. Accordingly, silicon carbide substrate 10 (see FIG. 1) is obtained.

Next, the silicon carbide layer forming step (S4: FIG. 15) is performed. For example, hot wall type CVD (Chemical Vapor Deposition) is used to form silicon carbide layer 20 on silicon carbide single crystal substrate 10 by epitaxial growth. Specifically, silicon carbide single crystal substrate 10 is placed in a CVD reaction chamber. For example, pressure in the reaction chamber is reduced from the atmospheric pressure to about $1 \times 10^{-6}$ Pa, and then the temperature of silicon carbide single crystal substrate 10 starts to be increased. For example, while increasing the temperature, hydrogen ($H_2$) gas, which is a carrier gas, is introduced into the reaction chamber.

After the temperature in the reaction chamber reaches, for example, about 1600° C., source material gas and doping gas are introduced into the reaction chamber. The source material gas includes Si source gas and C source gas. As the Si source gas, silane ($SiH_4$) gas can be used, for example. As the C source gas, propane ($C_3H_8$) gas can be used, for example. The flow rate of the silane gas and the flow rate of the propane gas are respectively 46 sccm and 14 sccm, for example. A volume ratio of the silane gas to the hydrogen is 0.04%, for example. A C/Si ratio in the source material gas is 0.9, for example.

Figure 16:
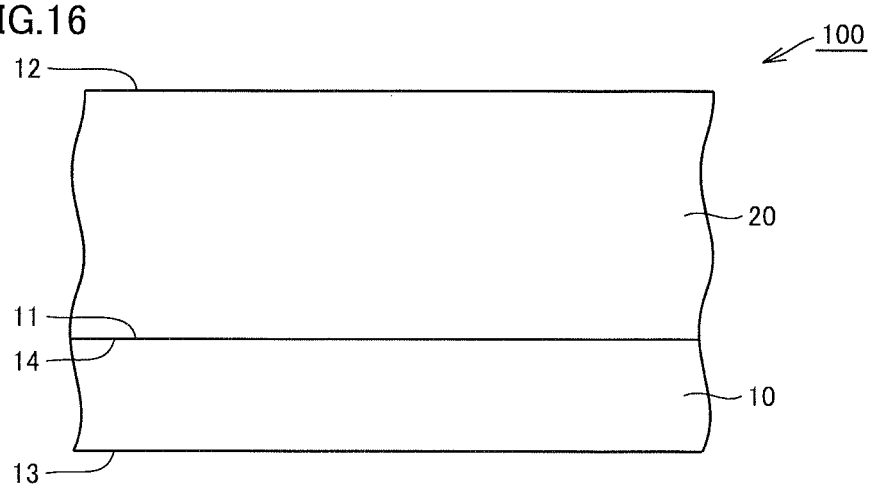
FIG. 16 is a schematic cross sectional view showing the method for manufacturing the silicon carbide epitaxial substrate according to the present embodiment.

As the doping gas, ammonia ($NH_3$) gas is used, for example. The ammonia gas is more likely to be thermally decomposed as compared with nitrogen gas that has triple bonds. By using the ammonia gas, it can be expected to improve in-plane uniformity of carrier concentration. The concentration of the ammonia gas with respect to the hydrogen gas is 1 ppm, for example. By introducing the carrier gas, the source material gas, and the doping gas into the reaction chamber with silicon carbide single crystal substrate 10 being heated at about 1600° C., silicon carbide layer 20 is formed on silicon carbide single crystal substrate 10 by epitaxial growth. Accordingly, silicon carbide epitaxial substrate 100 (see FIG. 16) is manufactured which has silicon carbide single crystal substrate 10 and silicon carbide layer 20. Silicon carbide layer 20 includes: a fourth main surface 14 in contact with first main surface 11; and a third main surface 12 opposite to fourth main surface 14.

(Method for Manufacturing Silicon Carbide Semiconductor Device)

The following describes a method for manufacturing a silicon carbide semiconductor device 200 according to the present embodiment.

Figure 17:
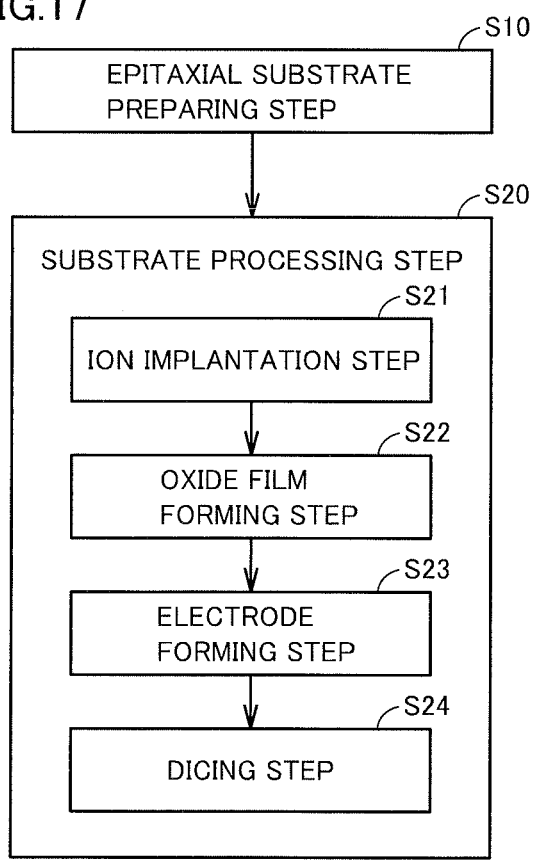
FIG. 17 is a flowchart schematically showing a method for manufacturing a silicon carbide semiconductor device according to the present embodiment.

The method for manufacturing the silicon carbide semiconductor device according to the present embodiment mainly includes an epitaxial substrate preparing step (S10: FIG. 17) and a substrate processing step (S20: FIG. 17).

First, the epitaxial substrate preparing step (S10: FIG. 17) is performed. Specifically, silicon carbide epitaxial substrate 100 is prepared by the above-described method for manufacturing the silicon carbide epitaxial substrate (see FIG. 16).

Next, the substrate processing step (S20: FIG. 17) is performed. Specifically, the silicon carbide epitaxial substrate is processed to Manufacture a silicon carbide semiconductor device. The term "process" encompasses various processes such as ion implantation, heat treatment, etching, oxide film formation, electrode formation, dicing, and the like. That is, the substrate processing step may include at least one of the ion implantation, the heat treatment, the etching, the oxide film formation, the electrode formation, and the dicing.

The following describes a method for manufacturing a MOSFET (Metal Oxide Semiconductor Field Effect Transistor) serving as an exemplary silicon carbide semiconductor device. The substrate processing step (S20: FIG. 17) includes an ion implantation step (S21: FIG. 17), an oxide film forming step (S22: FIG. 17), an electrode forming step (S23: FIG. 17), and a dicing step (S24: FIG. 17).

Figure 18:
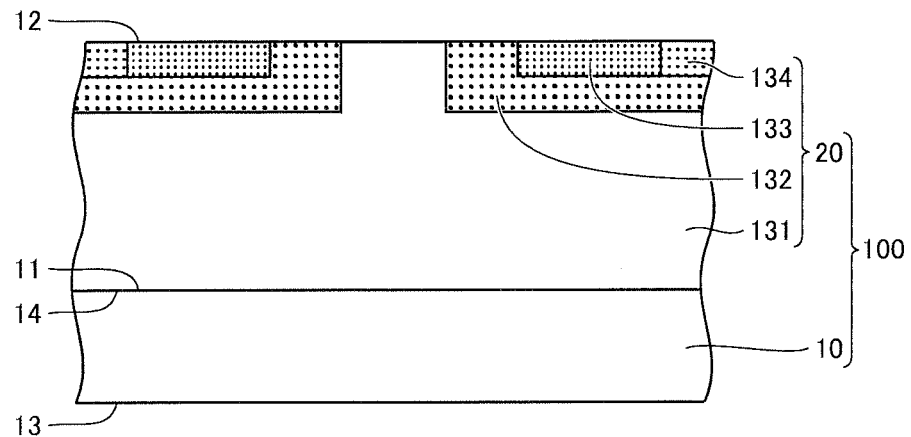
FIG. 18 is a schematic cross sectional view showing a first step of the method for manufacturing the silicon carbide semiconductor device according to the present embodiment.

First, the ion implantation step (S21: FIG. 17) is performed. For example, a p type impurity such as aluminum (Al) is implanted into third main surface 12 on which a mask (not shown) provided with an opening is formed. Accordingly, a body region 132 having p type conductivity is formed. Next, an n type impurity such as phosphorus (P) is implanted into body region 132 at a predetermined location, for example. Accordingly, a source region 133 having n type conductivity is formed. Next, a p type impurity such as aluminum is implanted into source region 133 at a predetermined location. Accordingly, a contact region 134 having p type conductivity is formed (see FIG. 18).

A portion of silicon carbide layer 20 other than body region 132, source region 133, and contact region 134 serves as a drift region 131. Source region 133 is separated from drift region 131 by body region 132. The ion implantation may be performed while heating silicon carbide epitaxial substrate 100 at about more than or equal to 300° C. and less than or equal to 600° C. After the ion implantation, activation annealing is performed to silicon carbide epitaxial substrate 100. By the activation annealing, the impurities implanted in silicon carbide layer 20 are activated, thereby generating carriers in each region. An atmosphere for the activation annealing may be an argon (Ar) atmosphere, for example. The temperature of the activation annealing may be about 1800° C., for example. The activation annealing may be performed for about 30 minutes, for example.

Figure 19:
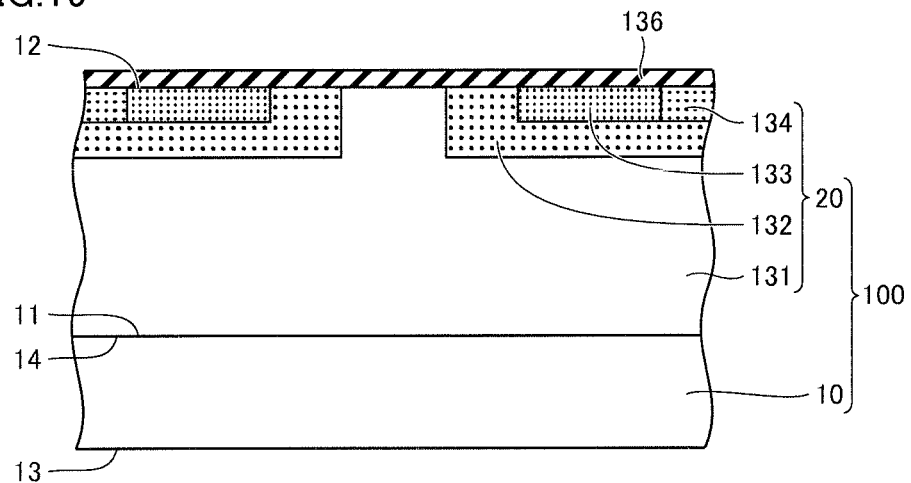
FIG. 19 is a schematic cross sectional view showing a second step of the method for manufacturing the silicon carbide semiconductor device according to the present embodiment.

Next, the oxide film forming step (S22: FIG. 17) is performed. For example, by heating silicon carbide epitaxial substrate 100 in an atmosphere including oxygen, an oxide film 136 is formed on third main surface 12 (see FIG. 19). Oxide film 136 is composed of silicon dioxide ($SiO_2$) or the like, for example. Oxide film 136 functions as a gate insulating film. The temperature of the thermal oxidation process may be about 1300° C., for example. The thermal oxidation process may be performed for about 30 minutes, for example.

After oxide film 136 is formed, a heat treatment may be further performed in a nitrogen atmosphere. For example, the heat treatment may be performed at about 1100° C. for about 1 hour in an atmosphere of nitrogen monoxide (NO), nitrous oxide ($N_2O$), or the like. Further, a heat treatment may be then performed in an argon atmosphere. For example, the heat treatment may be performed at about 1100 to 1500° C. in the argon atmosphere for about 1 hour.

Next, the electrode forming step (S23: FIG. 17) is performed. First electrode 141 is formed on oxide film 136. First electrode 141 functions as a gate electrode. First electrode 141 is formed by the CVD method, for example. First electrode 141 is composed of a conductive polysilicon containing an impurity, for example. First electrode 141 is formed at a location facing source region 133 and body region 132.

Next, an interlayer insulating film 137 is formed to cover first electrode 141. Interlayer insulating film 137 is formed by the CVD method, for example. Interlayer insulating film 137 is composed of silicon dioxide or the like, for example. Interlayer insulating film 137 is formed in contact with first electrode 141 and oxide film 136. Next, oxide film 136 and interlayer insulating film 137 at a predetermined location are removed by etching. Accordingly, source region 133 and contact region 134 are exposed through oxide film 136.

For example, second electrode 142 is formed at the exposed portion by a sputtering method. Second electrode 142 functions as a source electrode. Second electrode 142 is composed of titanium, aluminum, silicon, and the like, for example. After second electrode 142 is formed, second electrode 142 and silicon carbide epitaxial substrate 100 are heated at a temperature of about 900 to 1100° C., for example. Accordingly, second electrode 142 and silicon carbide epitaxial substrate 100 are brought into ohmic contact with each other. Next, an interconnection layer 138 is formed in contact with second electrode 142. Interconnection layer 138 is composed of a material including aluminum, for example.

Next, third electrode 143 is formed on second main surface 13. Third electrode 143 functions as a drain electrode. Third electrode 143 is composed of an alloy (for example, NiSi or the like) including nickel and silicon, for example.

Figure 20:
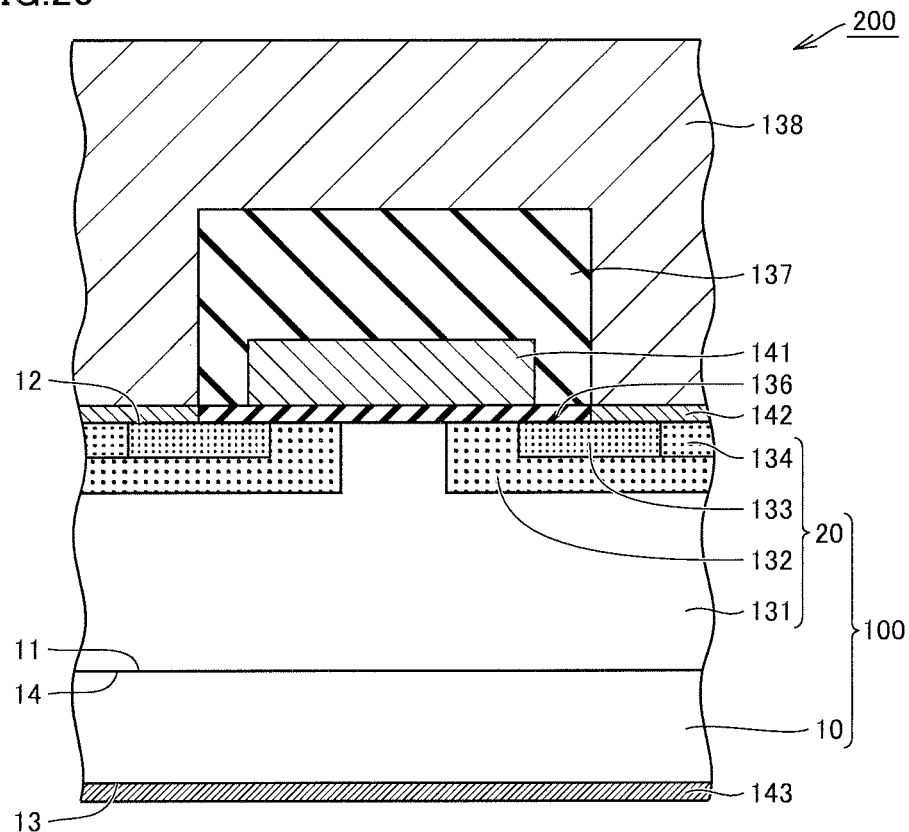
FIG. 20 is a schematic cross sectional view showing a third step of the method for manufacturing the silicon carbide semiconductor device according to the present embodiment.

Next, the dicing step (S24: FIG. 17) is performed. For example, silicon carbide epitaxial substrate 100 is diced along a dicing line, thereby dividing silicon carbide epitaxial substrate 100 into a plurality of semiconductor chips. Accordingly, silicon carbide semiconductor device 200 is manufactured (see FIG. 20).

In the description above, the method for manufacturing the MOSFET exemplarily serving as the silicon carbide semiconductor device according to the present disclosure has been described; however, the manufacturing method according to the present disclosure is not limited to this. The manufacturing method according to the present disclosure is applicable to various silicon carbide semiconductor devices such as an IGBT (Insulated Gate Bipolar Transistor), an SBD (Schottky Barrier Diode), a thyristor, a GTO (Gate Turn Off thyristor), and a PiN diode.

Next, the following describes the shape of silicon carbide substrate 10 manufactured by the method for manufacturing silicon carbide substrate 10 according to the present embodiment.

Figure 21:
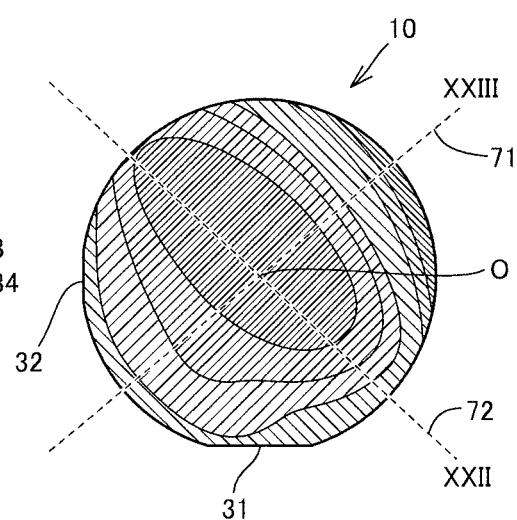
FIG. 21 shows a shape of a surface of a silicon carbide substrate according to a first example of the present embodiment.
Figure 24:
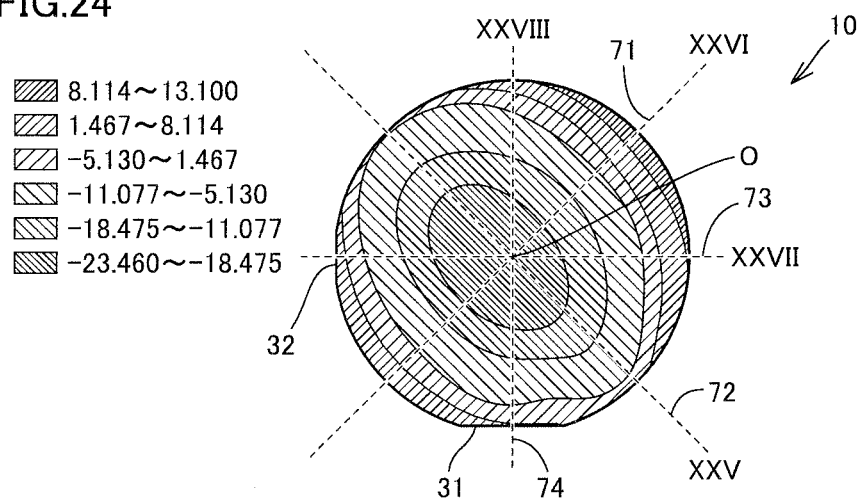
FIG. 24 shows a shape of a surface of a silicon carbide substrate according to a second example of the present embodiment.
Figure 29:
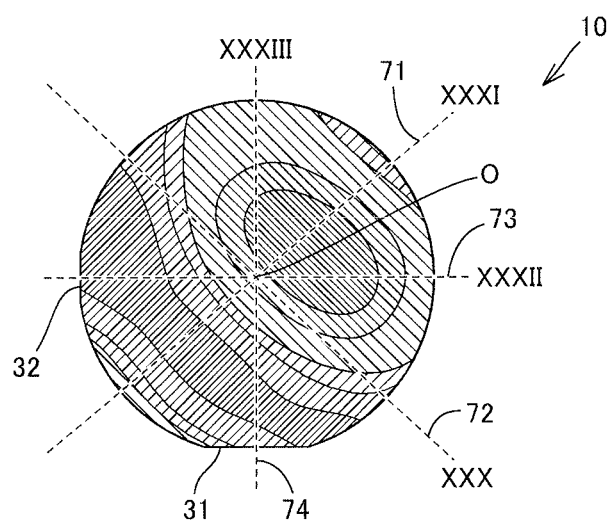
FIG. 29 shows a shape of a surface of a silicon carbide substrate according to a third example of the present embodiment.

The shape of silicon carbide substrate 10 can be measured using FlatMaster® provided by Corning Tropel, for example. Each of FIG. 21, FIG. 24, and FIG. 29 is a diagram showing heights of first main surface 11 in the [0001] direction with contour lines. In FIG. 21, FIG. 24, and FIG. 29, regions with the same or similar height are indicated using the same hatching.

As shown in FIG. 21, a protrusion of first main surface 11 may extend along a direction 72 perpendicular to a direction 71 that bisects an angle between a direction from center O toward first orientation flat 31 and a direction from center O toward second orientation flat 32. First main surface 11 has a bow of a positive value. Direction 71 is a direction that bisects the angle between the [11-20] direction and the [1-100] direction. When viewed in the direction perpendicular to second main surface 13, the shape of the protrusion may be an elliptical shape, for example.

Figure 22:
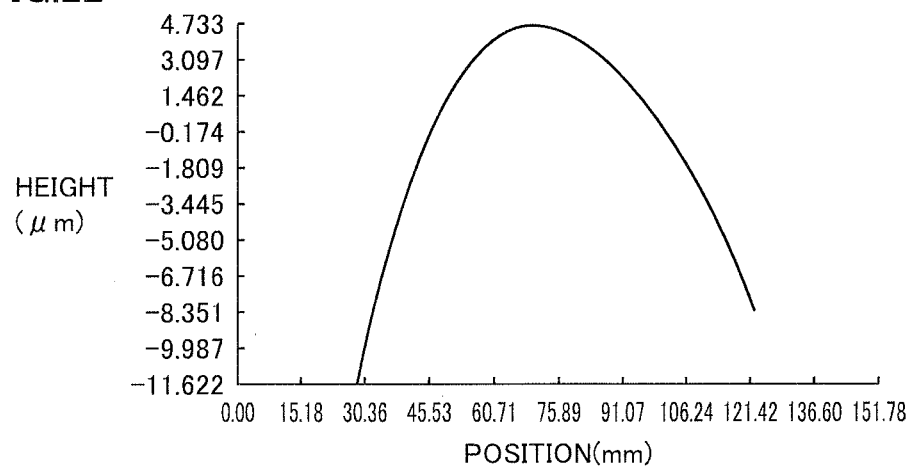
FIG. 22 shows a height profile measured along an XXII-XXII line of FIG. 21.
Figure 23:
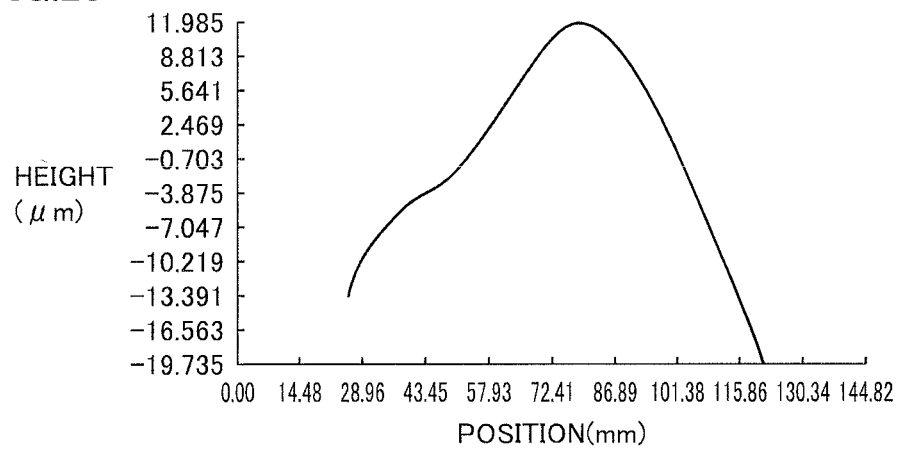
FIG. 23 shows a height profile measured along an XXIII-XXIII line of FIG. 21.

As shown in FIG. 22, a relative position in the [0001] direction becomes lower in the direction from the center of first main surface 11 toward the outer edge of first main surface 11 on the straight line along direction 72. As shown in FIG. 23, the relative position in the [0001] direction becomes lower in the direction from the center of first main surface 11 toward the outer edge of first main surface 11 on the straight line along direction 71. As shown in FIG. 21 to FIG. 23, the height of the protrusion in direction 72 is about 2.2 times as large as the height of the protrusion in direction 71.

Figure 25:
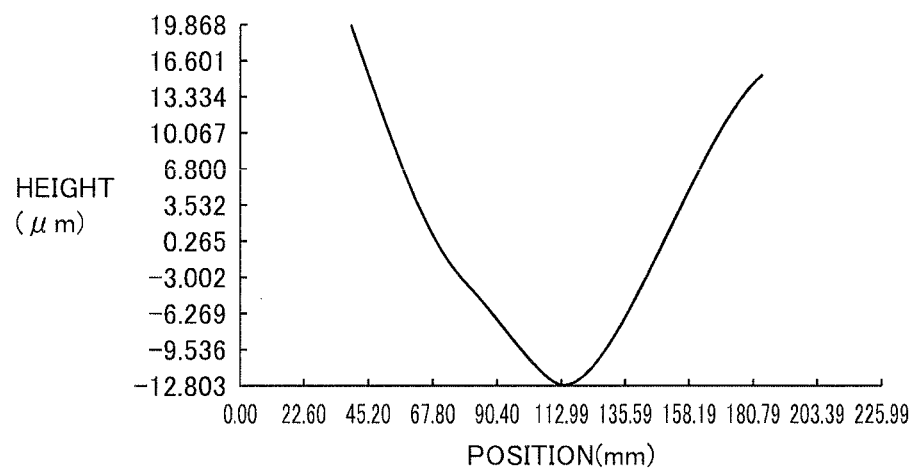
FIG. 25 shows a height profile measured along an XXV-XXV line of FIG. 24.
Figure 26:
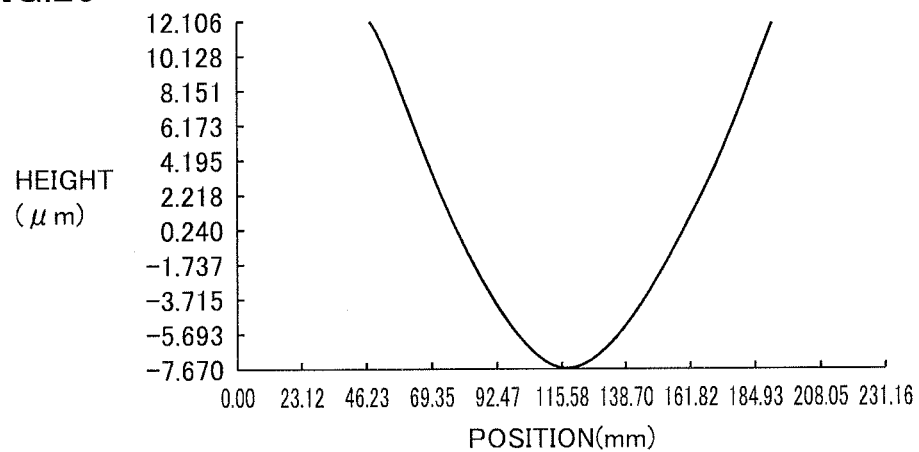
FIG. 26 shows a height profile measured along an XXVI-XXVI line of FIG. 24.

As shown in FIG. 24, a recess of first main surface 11 may extend along direction 72. First main surface 11 has a bow of a negative value. As shown in FIG. 25, a relative position in the [0001] direction becomes higher in the direction from the center of first main surface 11 toward the outer edge of first main surface 11 on the straight line along direction 72. As shown in FIG. 26, the relative position in the direction becomes higher in the direction from the center of first main surface 11 toward the outer edge of first main surface 11 on the straight line along direction 71. When viewed in the direction perpendicular to second main surface 13, the shape of the recess may be an elliptical shape, for example.

Figure 27:
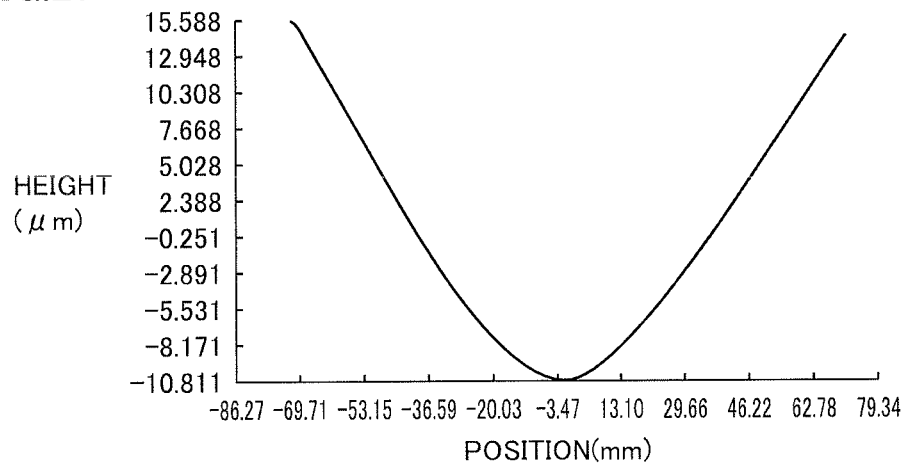
FIG. 27 shows a height profile measured along an XXVII-XXVII line of FIG. 24.
Figure 28:
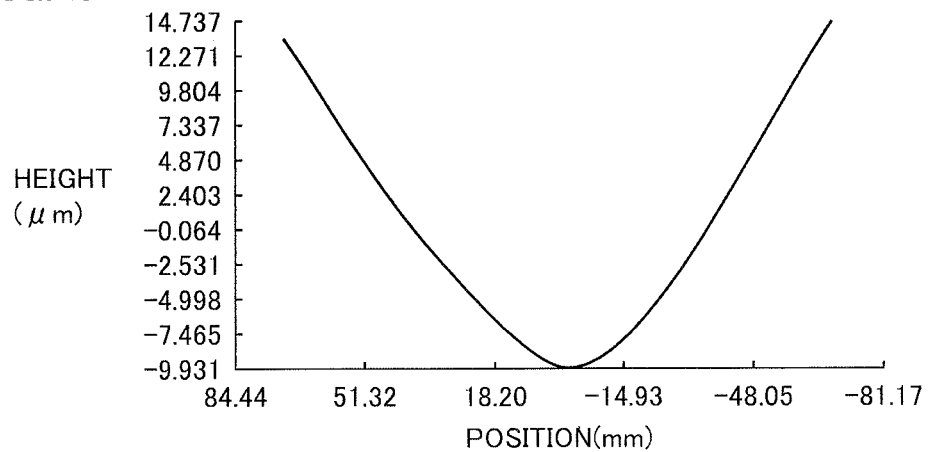
FIG. 28 shows a height profile measured along an XXVIII-XXVIII line of FIG. 24.

As shown in FIG. 27, the relative position in the [0001] direction becomes higher in the direction from the center of first main surface 11 toward the outer edge of first main surface 11 on the straight line along direction 73. Direction 73 is a direction parallel to the [11-20] direction. As shown in FIG. 28, the relative position in the direction becomes higher in the direction from the center of first main surface 11 toward the outer edge of first main surface 11 on the straight line along direction 74. Direction 74 is a direction parallel to the [1-100] direction. As shown in FIG. 24 to FIG. 28, the height of the recess in direction 72 is about 1.5 times as large as the height of the recess in direction 71.

Figure 30:
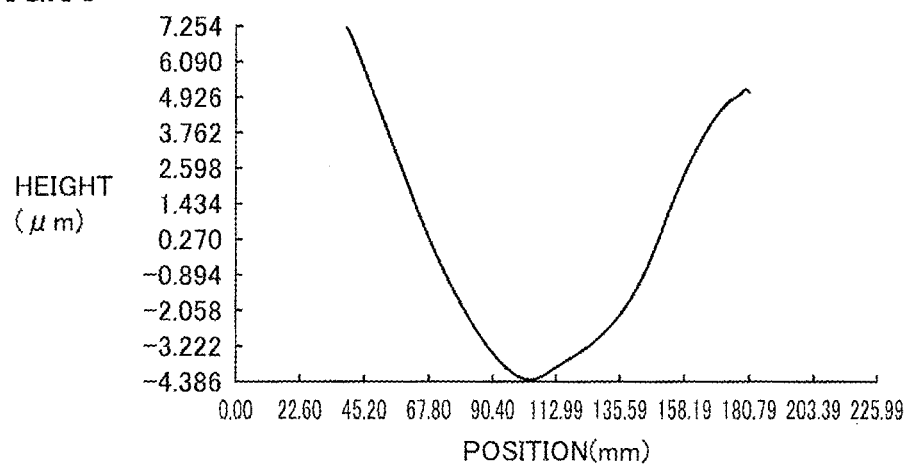
FIG. 30 shows a height profile measured along an XXX-XXX line of FIG. 29.
Figure 31:
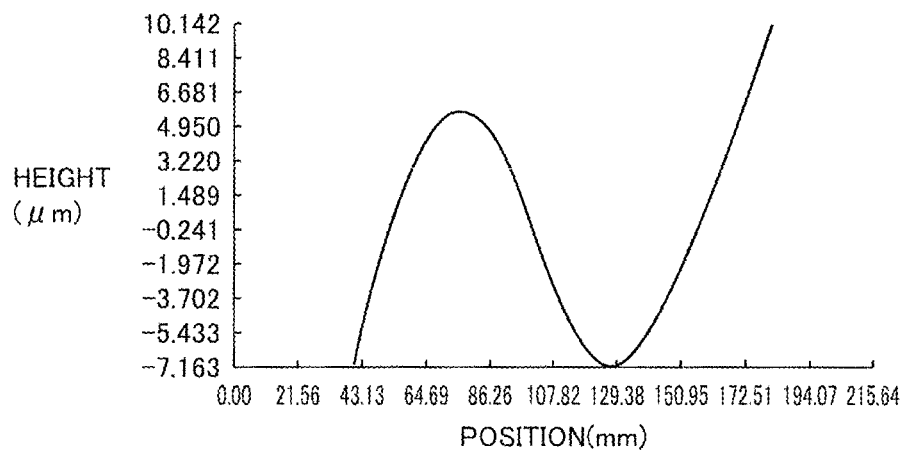
FIG. 31 shows a height profile measured along an XXXI-XXXI line of FIG. 29.

As shown in FIG. 29, a recess of first main surface 11 may extend along a direction parallel to direction 72. As shown in FIG. 30, a relative position in the [0001] direction becomes higher in the direction from the center of first main surface 11 toward the outer edge of first main surface 11 on the straight line along direction 72. As shown in FIG. 31, on the straight line along direction 71, the relative position in the [0001] direction becomes lower in the direction from the center of first main surface 11 to separate from first orientation flat 31 and second orientation flat 32, exhibits a minimum value, and then becomes higher. On the other hand, on the straight line along direction 71, the relative position in the [0001] direction becomes higher in the direction from the center of first main surface 11 to approach first orientation flat 31 and second orientation flat 32, exhibits a maximum value, and then becomes lower.

Figure 32:
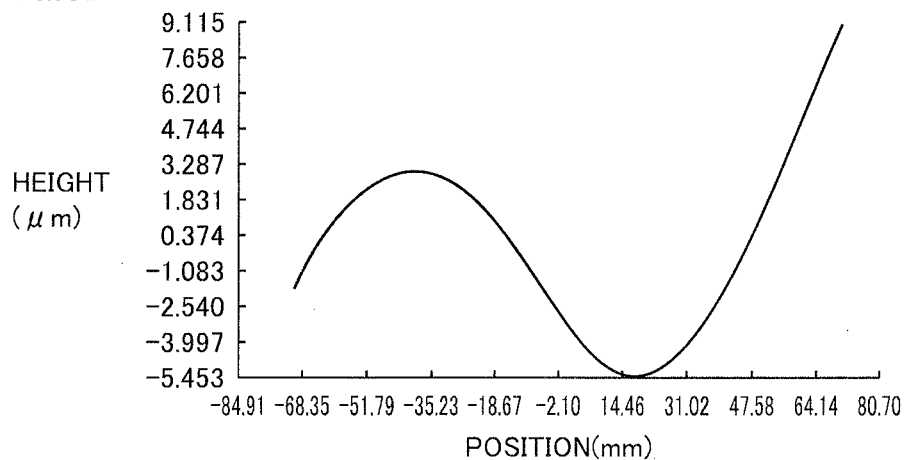
FIG. 32 shows a height profile measured along an XXXII-XXXII line of FIG. 29.
Figure 33:
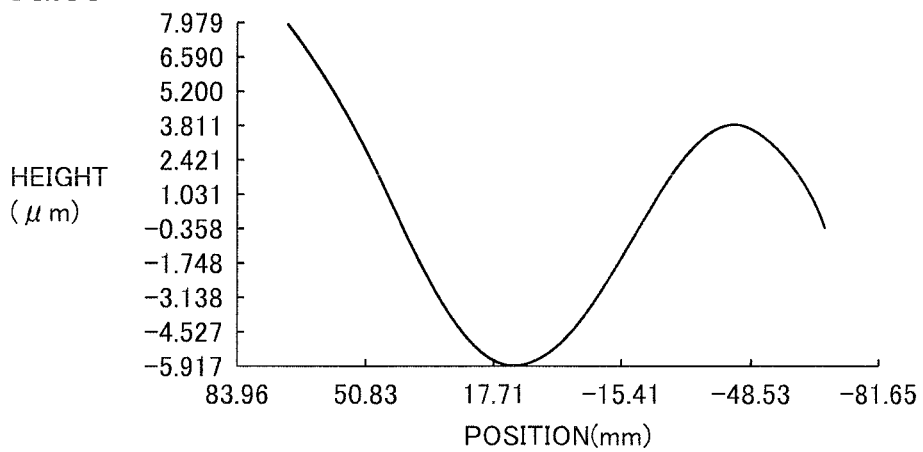
FIG. 33 shows a height profile measured along an XXXIII-XXXIII line of FIG. 29.

As shown in FIG. 32, on the straight line along direction 73, the relative position in the [0001] direction becomes lower in the direction from the center of first main surface 11 to separate from second orientation flat 32, exhibits a minimum value, and then becomes higher. On the other hand, on the straight line along direction 73, the relative position in the [0001] direction becomes higher in the direction from the center of first main surface 11 to approach second orientation flat 32, exhibits a maximum value, and then becomes lower. As shown in FIG. 33, on the straight line along direction 74, the relative position in the [0001] direction becomes lower in the direction from the center of first main surface 11 to separate from first orientation flat 31, exhibits a minimum value, and then becomes higher. On the other hand, on the straight line along direction 74, the relative position in the [0001] direction becomes higher in the direction from the center of first main surface 11 to approach first orientation flat 31, exhibits a maximum value, and then becomes lower. As shown in FIG. 29 to FIG. 33, the height of the recess in the direction parallel to direction 72 is about 1.6 times as large as the height of the recess in direction 71.

As described above, in silicon carbide substrate 10 according to the present embodiment, the recess or the protrusion extends in the direction perpendicular to the direction that bisects the angle between the [11-20] direction and the [1-100] direction. By changing conditions of the mechanical polishing, chemical mechanical polishing, and removal of processing strains, first main surface 11 can be formed into a recessed shape or a protruding shape. However, it is difficult to change the extending directions of the recess and the protrusion by changing the conditions of the mechanical polishing, chemical mechanical polishing, and removal of process strains because the extending directions of the recess and the protrusion strongly depend on the slicing direction. According to silicon carbide substrate 10 according to the present embodiment, the height of the recess or the protrusion in direction 71 perpendicular to direction 72 that bisects the angle between the [11-20] direction and the [1-100] direction is more than or equal to 1.2 times and less than or equal to 2.5 times as large as the height of the recess or the protrusion in the direction parallel to direction 72 that bisects the angle between the [11-20] direction and the [1-100] direction.

(Evaluation 1)
(Preparation of Samples)

First, silicon carbide ingots 1 (see FIG. 5 and FIG. 6) of samples 1 to 4 were prepared using the sublimation method. The diameter and thickness of each of the silicon carbide ingots were 100 mm and 10 mm, respectively. First orientation flat 21 and second orientation flat 22 are provided at side surface 5 of silicon carbide ingot 1. First orientation flat 21 corresponds to the (1-100) plane. Second orientation flat 22 corresponds to the (11-20) plane. Top surface 3 corresponds to the (0001) plane. Bottom surface 4 corresponds to the (000-1) plane.

Next, silicon carbide ingot 1 was sliced using wire 2. Inclination of silicon carbide ingot 1 relative to the extending direction of wire 2 was adjusted using a goniometer such that: first main surface 11 of silicon carbide substrate 10 after the slicing corresponds to a plane inclined by 4° relative to the (0001) plane in the <11-20> direction; and inclination of first main surface 11 relative to the <1-100> direction becomes 0°. Diamond abrasive grains 6 were electrodeposited on wire 2. The grain size of each of diamond abrasive grains 6 was more than or equal to 30 μm and less than or equal to 40 μm. The diameter of wire 2 was 180 μm. Water-soluble grinding liquid was used as coolant. A linear velocity of wire 2 was 1200 m/minute. A tension of wire 2 was 45 N. When cutting silicon carbide ingot 1, each of wire 2 and silicon carbide ingot 1 was repeatedly shaken. Silicon carbide ingot 1 was cut with silicon carbide ingot 1 being moved up and down in the direction perpendicular to the extending direction of wire 2.

Figure 34:
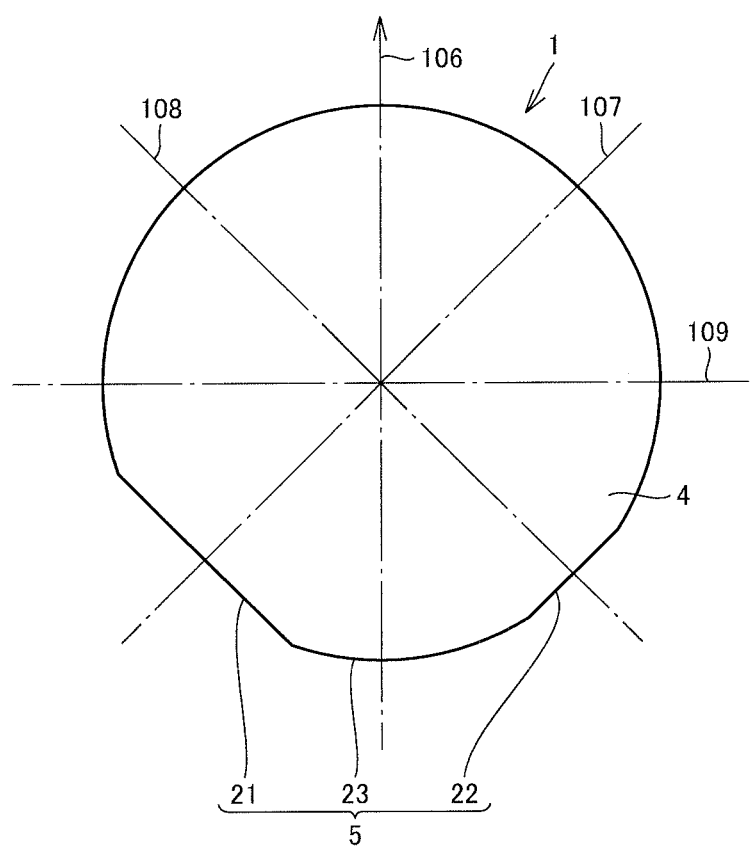
FIG. 34 shows a cutting direction of a silicon carbide ingot of each of samples 1 to 4.

As shown in FIG. 34, when viewed in the direction perpendicular to bottom surface 4, silicon carbide ingot 1 according to sample 1 is cut along direction 107 parallel to the [1-100] direction. When viewed in the direction perpendicular to bottom surface 4, silicon carbide ingot 1 according to sample 2 is cut along direction 108 parallel to the [11-20] direction. When viewed in the direction perpendicular to bottom surface 4, silicon carbide ingot 1 according to sample 3 is cut along direction 109 perpendicular to direction 106. When viewed in the direction perpendicular to bottom surface 4, silicon carbide ingot 1 according to sample 4 is cut along direction 106 parallel to the direction that bisects the angle formed by the [1-100] direction and the [11-20] direction.

Next, first main surface 11 and second main surface 13 of each silicon carbide substrate 10 were polished using the diamond abrasive grains, and therefore were both mirror-finished. Next, colloidal silica was used to perform chemical mechanical polishing onto first main surface 11 and second main surface 13. Next, silicon carbide substrate 10 was cleaned by acidic cleaning liquid and alkaline cleaning liquid. In this way, silicon carbide substrates 10 according to samples 1 to 4 were prepared. The thickness of each of silicon carbide substrates 10 was 450 μm.

(Experiment Method)

The SORI of first main surface 11 of silicon carbide substrate 10 according to each of samples 1 to 4 was measured using FlatMaster® provided by Corning Tropel. The roughness of first main surface 11 of silicon carbide substrate 10 according to each of samples 1 to 4 was measured using a light interference type roughness measuring device provided by Ryoka Systems Inc. Measurement positions were the center of first main surface 11 and eight positions at the outer circumferential side. The eight measurement positions at the outer circumferential side were respectively in orientations of 0°, 45°, 90°, 135°, 180°, 225°, 270° and 315° when viewed in the direction perpendicular to first main surface 11. The eight measurement positions at the outer circumferential side are positions separated by about 3 mm from the outer edge toward the center. A measurement region was a square region of 64 μm×64 μm. An area average roughness Sq and an area maximum roughness St were calculated. A flaw of first main surface 11 of silicon carbide substrate 10 according to each of samples 1 to 4 was measured using a differential interference microscope. The magnification of the objective lens and the magnification of the ocular lens were ×5 and ×10, respectively. First main surface 11 at the silicon plane side was observed in perpendicularly crossing directions so as to count flaws each having a length or width of more than or equal to 50 μm.

(Experiment Results)

TABLE 1

| Sample Number | Sample 1 | Sample 2 | Sample 3 | Sample 4 |
|---|---|---|---|---|
| SORI (μm) | 38 | 46 | 22 | 18 |
| Roughness Sq (μm) | 0.21 | 0.22 | 0.18 | 0.18 |
| Roughness St (μm) | 0.25 | 0.26 | 0.13 | 0.12 |
| Number of Flaws | 15 | 18 | 5 | 4 |
| Quality Rank | 3 | 4 | 2 | 1 |

The following describes the SORI, roughness Sq, roughness St, the number of flaws, and the quality rank of first main surface 11 of silicon carbide substrate 10 according to each of samples 1 to 4. As shown in Table 1, the SORIs of first main surfaces 11 of silicon carbide substrates 10 according to samples 1 to 4 were 38 μm, 46 μm, 22 μm, and 18 μm, respectively. Roughnesses Sq of first main surfaces 11 of silicon carbide substrates 10 according to samples 1 to 4 were 0.21 μm, 0.22 μm, 0.18 μm, and 0.18 μm, respectively. Roughnesses St of first main surfaces 11 of silicon carbide substrates 10 according to samples 1 to 4 were 0.25 μm, 0.26 μm, 0.13 μm, and 0.12 μm, respectively. The numbers of flaws in first main surfaces 11 of silicon carbide substrates 10 according to samples 1 to 4 were 15, 18, 5, and 4, respectively.

In each of samples 1 and 2, the cleavage direction of the silicon carbide is the same as the travel direction of the wire. Therefore, it is considered that the roughness of the cut surface was deteriorated due to a saw mark suddenly generated during cutting. On the other hand, in each of samples 3 and 4, the cleavage direction of the silicon carbide is different from the travel direction of the wire. It was proved that silicon carbide substrate 10 according to sample 4 had a smaller SORT, a smaller roughness St, and a smaller number of flaws than those of silicon carbide substrates 10 according to samples 1 to 3. Comprehensively, it is considered that the quality of silicon carbide substrate 10 according to sample 4 is the most excellent among silicon carbide substrates 10 according to samples 1 to 4.

(Evaluation 2)

(Preparation of Samples)

Figure 35:
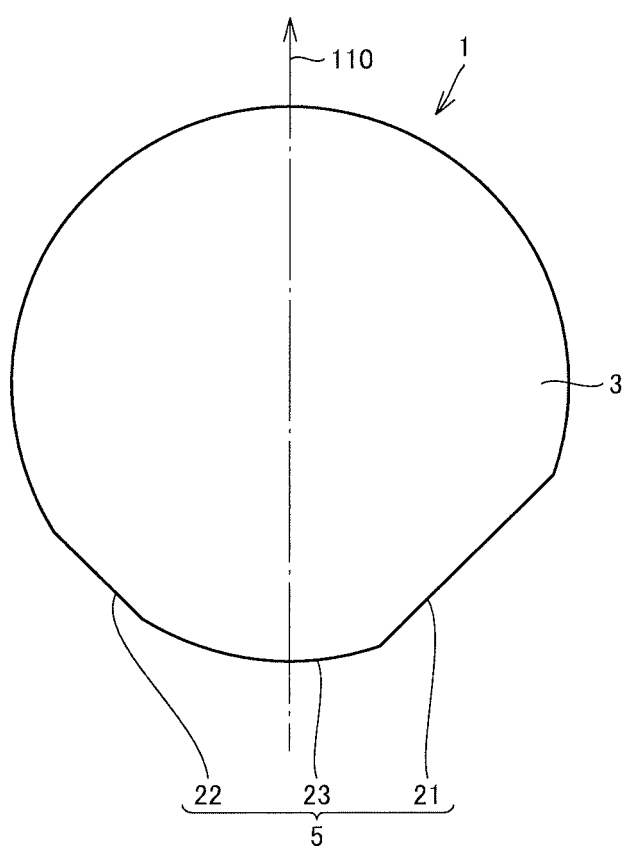
FIG. 35 shows a cutting direction of a silicon carbide ingot of a sample 5.

A silicon carbide substrate 10 of a sample 5 was prepared using the same method as sample 4 except for the following point. Silicon carbide ingot 1 of sample 5 was cut from side surface 5 (see FIG. 9) at the silicon plane side (see FIG. 35), whereas silicon carbide ingot 1 of sample 4 was cut from side surface 5 (see FIG. 9) at the carbon plane side (see FIG. 34). Cutting conditions for silicon carbide ingot 1 of the sample 5 other than the cutting direction were the same as those for silicon carbide ingot 1 of sample 4. That is, cutting direction 106 of silicon carbide ingot 1 of sample 4 is parallel to and opposite to cutting direction 110 of silicon carbide ingot 1 of sample 5.

(Experiment Method)

The SORI of first main surface 11, roughnesses Sq and St of first main surface 11, and the number of flaws of first main surface 11 in silicon carbide substrate 10 according to sample 5 were measured using the same method as the method for those of silicon carbide substrates 10 according to samples 1 to 4.

(Experiment Results)

TABLE 2

| Sample Number | Sample 4 | Sample 5 |
|---|---|---|
| SORI (μm) | 18 | 23 |
| Roughness Sq (μm) | 0.18 | 0.19 |
| Roughness St (μm) | 0.12 | 0.13 |
| Number of Flaws | 4 | 6 |
| Quality Rank | 1 | 2 |

The following describes the SORI, roughness Sq, roughness St, the number of flaws, and the quality rank of first main surface 11 of silicon carbide substrate 10 according to sample 5. As shown in Table 2, the SORI of first main surface 11 of silicon carbide substrate 10 according to sample 5 was 23 μm. Roughness Sq and roughness St of first main surface 11 of silicon carbide substrate 10 according to sample 5 were 0.19 μm and 0.13 μm, respectively. The number of flaws in first main surface 11 of silicon carbide substrate 10 according to sample 5 was 6. The quality of silicon carbide substrate 10 according to sample 4 was more excellent than the quality of silicon carbide substrate 10 according to sample 5.

According to the above result, it was proved that sample 4 obtained by cutting from the side surface at the carbon plane side had a smaller SORT, smaller roughness Sq and roughness St, and a small number of flaws than those of silicon carbide substrate 10 according to sample 5 obtained by cutting from the side surface at the silicon plane side.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: silicon carbide ingot; 2: wire; 3: top surface; 4: bottom surface; 5: side surface; 6: diamond abrasive grain; 10: silicon carbide substrate (silicon carbide single crystal substrate); 11: first main surface; 12: third main surface; 13: second main surface; 14: fourth main surface; 20: silicon carbide layer; 21, 31: first orientation flat (first flat); 22, 32: second orientation flat (second flat); 23, 33: curved portion; 30: circumferential edge portion; 41: diameter; 42: grain size; 50: longitudinal direction; 52: guide roller; 53: wire guide groove; 54: nozzle; 100: silicon carbide epitaxial substrate; 101: off direction; 101: first direction; 102: second direction; 103: third direction; 104: fourth direction; 106, 110: cutting direction; 131: drift region; 132: body region; 133: source region; 134: contact region; 136: oxide film; 137: interlayer insulating film; 138: interconnection layer; 141: first electrode; 142: second electrode; 143: third electrode; 200: silicon carbide semiconductor device; 300: cutting apparatus.

The invention claimed is:

1. A method for manufacturing a silicon carbide substrate, the method comprising:
preparing a silicon carbide ingot; and
cutting the silicon carbide ingot using a wire,
the silicon carbide ingot having a polytype of 4H—SiC,
the silicon carbide ingot including a top surface, a bottom surface opposite to the top surface, and a side surface between the top surface and the bottom surface,
a direction from the bottom surface toward the top surface being a direction parallel to a direction or a direction inclined by less than or equal to 8° relative to the [0001] direction,
in the cutting of the silicon carbide ingot, the silicon carbide ingot being cut from the side surface at a (000-1) plane side along a straight line parallel to a direction within ±5° relative to a direction that bisects an angle formed by a [1-100] direction and a [11-20] direction when viewed in the direction from the bottom surface toward the top surface.

2. The method for manufacturing the silicon carbide substrate according to claim 1, wherein in the cutting of the silicon carbide ingot, a linear velocity of the wire is more than or equal to 1000 m/minute.

3. The method for manufacturing the silicon carbide substrate according to claim 1, wherein in the cutting of the silicon carbide ingot, a tension of the wire is less than or equal to 70% of a breaking tension of the wire.

4. The method for manufacturing the silicon carbide substrate according to claim 1, wherein a diameter of the wire is less than or equal to 200 μm.

5. The method for manufacturing the silicon carbide substrate according to claim 1, wherein a diamond abrasive grain is fixed to the wire.

6. The method for manufacturing the silicon carbide substrate according to claim 5, wherein a grain size of the diamond abrasive grain is less than or equal to 50 μm.

7. A method for manufacturing a silicon carbide substrate, the method comprising:
preparing a silicon carbide ingot; and
cutting the silicon carbide ingot using a wire,
the silicon carbide ingot including a top surface, a bottom surface opposite to the top surface, and a side surface between the top surface and the bottom surface,
a direction from the bottom surface toward the top surface being a direction parallel to a direction or a direction inclined by less than or equal to 8° relative to the [0001] direction,
in the cutting of the silicon carbide ingot, the silicon carbide ingot being cut from the side surface at a (000-1) plane side along a straight line parallel to a direction within ±5° relative to a direction that bisects an angle formed by a [1-100] direction and a [11-20] direction when viewed in the direction from the bottom surface toward the top surface,
in the cutting of the silicon carbide ingot, a linear velocity of the wire being more than or equal to 1000 m/minute,
a tension of the wire being less than or equal to 70% of a breaking tension of the wire,
a diameter of the wire being less than or equal to 200 μm,
a diamond abrasive grain being fixed to the wire,
a grain size of the diamond abrasive grain being less than or equal to 50 μn.

8. A method for manufacturing a silicon carbide epitaxial substrate, the method comprising:
preparing a silicon carbide substrate by the manufacturing method recited in claim 1; and
forming a silicon carbide layer on the silicon carbide substrate.

9. A method for manufacturing a silicon carbide semiconductor device, the method comprising:
preparing a silicon carbide epitaxial substrate by the manufacturing method recited in claim 8; and
processing the silicon carbide epitaxial substrate.

* * * * *